US005710698A

United States Patent [19]
Lai et al.

[11] Patent Number: 5,710,698
[45] Date of Patent: *Jan. 20, 1998

[54] DELTA CONNECTED RESONANT SNUBBER CIRCUIT

[75] Inventors: Jih-Sheng Lai, Knoxville; Fang Zheng Peng; Robert W. Young, Sr., both of Oak Ridge; George W. Ott, Jr., Knoxville, all of Tenn.

[73] Assignee: Lockheed Martin Energy Systems, Inc., Oak Ridge, Tenn.

[*] Notice: The term of this patent shall not extend beyond the expiration date of Pat. No. 5,642,273.

[21] Appl. No.: 540,302

[22] Filed: Oct. 6, 1995

Related U.S. Application Data

[63] Continuation-in-part of Ser. No. 316,612, Sep. 30, 1994, abandoned.

[51] Int. Cl.⁶ .................................................. H02H 7/122
[52] U.S. Cl. ........................ 363/56; 363/98; 363/132
[58] Field of Search ............................ 363/55, 56, 16, 363/97, 98, 131, 132; 323/222

[56] References Cited

U.S. PATENT DOCUMENTS

| | | | |
|---|---|---|---|
| 5,172,309 | 12/1992 | DeDoncker et al. | 363/132 |
| 5,410,467 | 4/1995 | Smith et al. | 363/131 |
| 5,477,131 | 12/1995 | Gegner | 323/222 |
| 5,570,260 | 10/1996 | Kanai et al. | 361/91 |

OTHER PUBLICATIONS

"The Resonant DC Link Converter—A New Concept in Static Power Conversion," by D. M. Divan, Department of Electrical and Computer Engineering, University of Wisconsin, CH2272-3/86/0000-0648, ©1986 IEEE.

"A Rugged Soft Commutated PWM Inverter for AC Drives," by Ahmed Cheriti, et al, IEEE Log No. 9107102, 0885-8993 ©1992 IEEE.

"Resonant Snubbers with Auxiliary Switches," by William McMurray, Fellow, IEEE, IEEE Log No. 9207141, 0093-9994 ©1993 IEEE.

*Primary Examiner*—Peter S. Wong
*Assistant Examiner*—Y. J. Han
*Attorney, Agent, or Firm*—Luedeka, Neely & Graham

[57] ABSTRACT

A delta connected, resonant snubber-based, soft switching, inverter circuit achieves lossless switching during dc-to-ac power conversion and power conditioning with minimum component count and size. Current is supplied to the resonant snubber branches solely by the dc supply voltage through the main inverter switches and the auxiliary switches. Component count and size are reduced by use of a single semiconductor switch in the resonant snubber branches. Component count is also reduced by maximizing the use of stray capacitances of the main switches as parallel resonant capacitors. Resonance charging and discharging of the parallel capacitances allows lossless, zero voltage switching. In one embodiment, circuit component size and count are minimized while achieving lossless, zero voltage switching within a three-phase inverter.

19 Claims, 19 Drawing Sheets

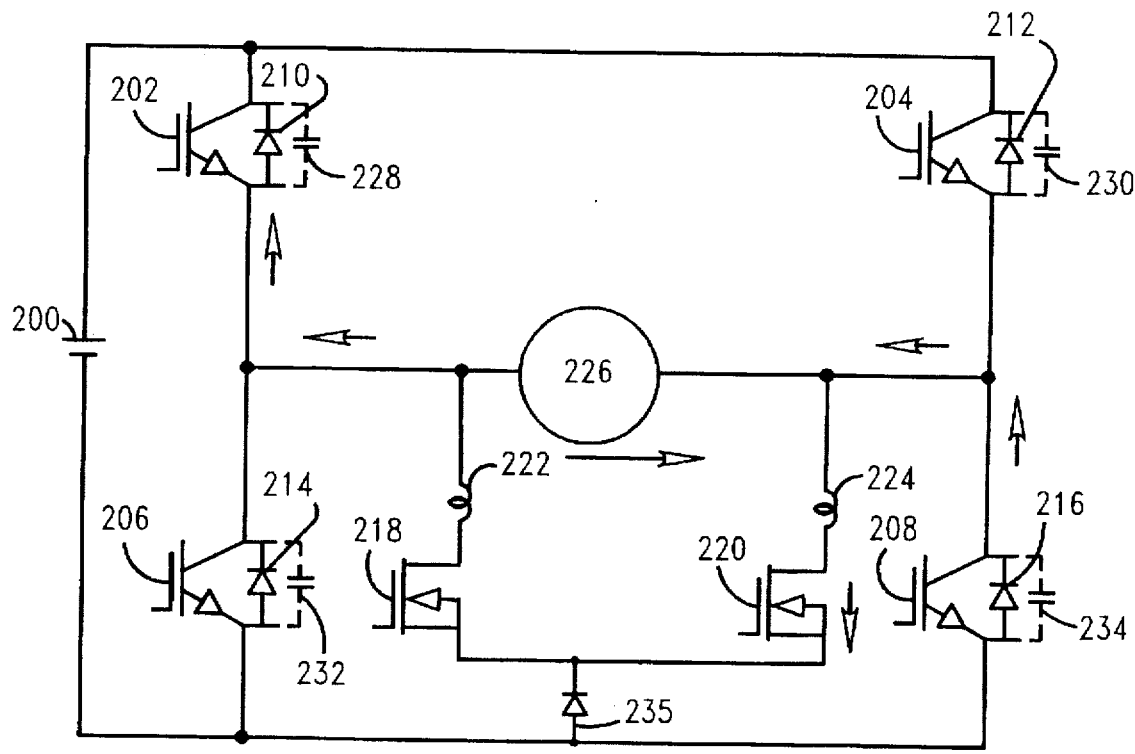
*Fig.*10
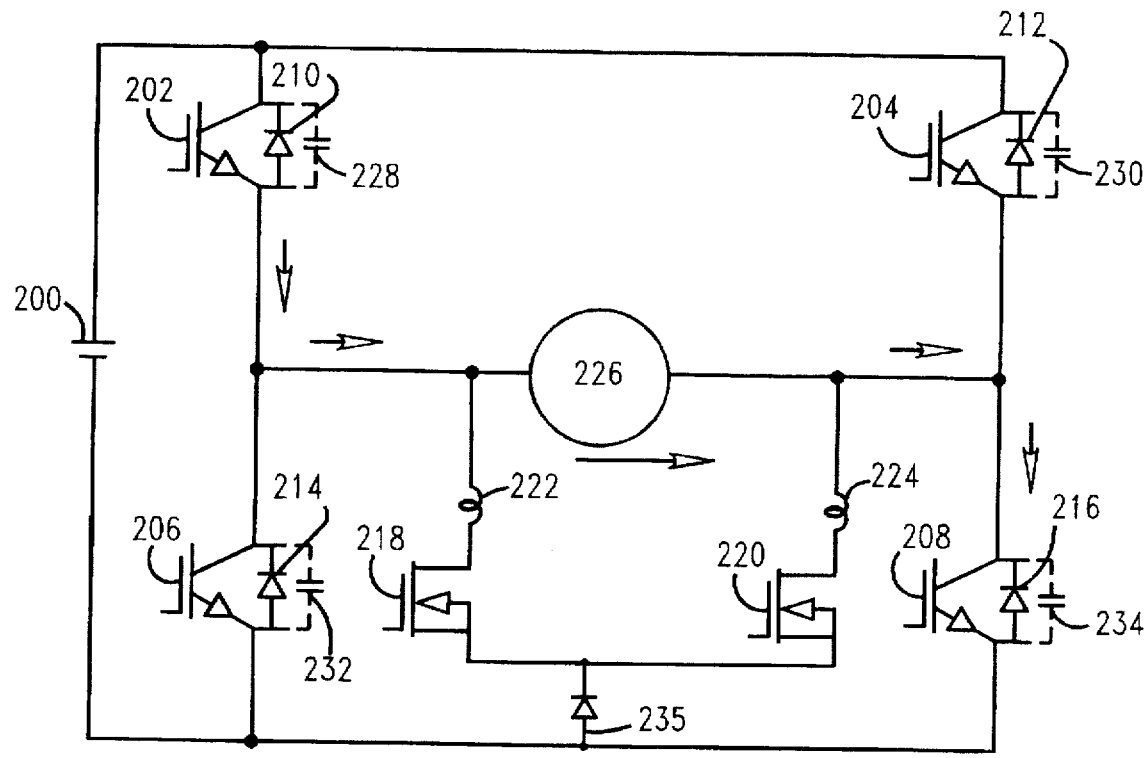
*Fig.*11

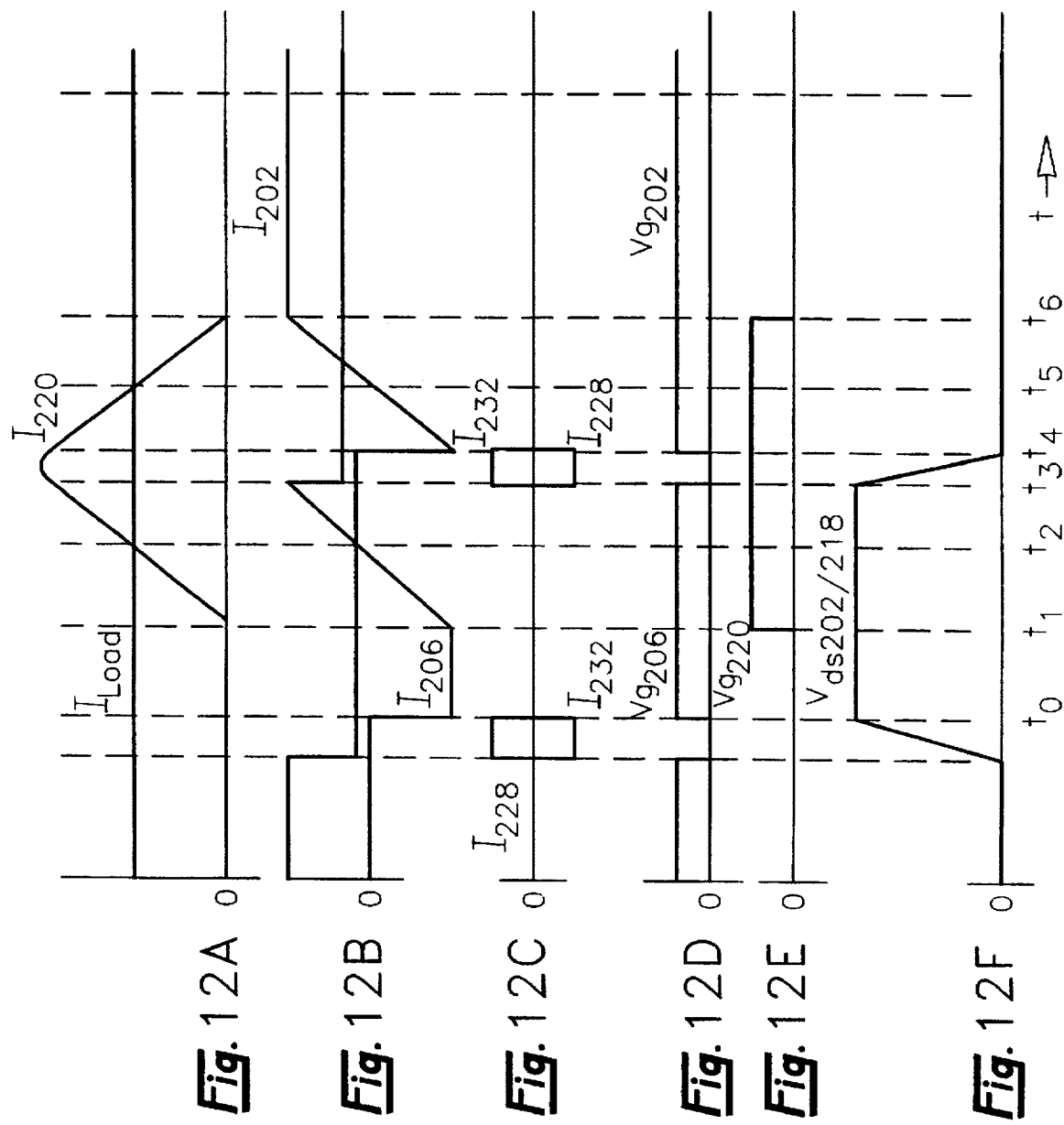

DELTA CONNECTED RESONANT SNUBBER CIRCUIT

TECHNICAL FIELD

This is a continuation-in-part of application Ser. No. 08/316,612 filed Sep. 30, 1994, now the entire disclosure of which is incorporated herein by reference.

This invention was made with Government support order Contract DE-AC05-84OR21400 awarded by the U.S. Department of Energy to Lockheed-Martin Energy Systems, Inc., and the Government has certain rights to this invention.

The present invention is directed to a resonant snubber based soft switching inverter circuit for achieving lossless switching of circuit components during dc-to-ac power conversion and power conditioning.

BACKGROUND

Switching losses during dc-to-ac power conversion in conventional inverters are highly undesirable. Switching losses can occur for a variety of reasons, including simultaneous voltage across the switch and current through the switch during turn-on. Switching losses may also occur as a result of reverse recovery current of a diode across the opposite side of the switch. Such switching losses increase the need for component shielding due to EMI noise, and require greater heat protection due to increased power consumption. These undesirable effects of switching losses increase costs and reduce efficiency, thus reducing the acceptance of such conventional inverter techniques to industries. A resonant inverter circuit which achieves lossless, or zero voltage switching (soft switching) is therefore needed for efficiency reasons.

Soft switching snubber inverters of the present type normally use the resonant technique to reduce or eliminate the switching loss so that the frequency can be increased. High frequency soft switching improves inverter performance by elimination of acoustic noises and electromagnetic interferences, reduction of torque ripple, and improvement of efficiency. However, the resonant circuit generally produces either over-voltage or over-current conditions during switching. A typical resonant dc link inverter driving a three-phase ac motor can experience a peak dc bus voltage of twice the supply voltage in motoring mode operation, and the overshoot voltage can be more than three times the supply voltage in the regenerative mode. These inverters are also restricted to switching only at the zero voltage crossing to avoid short circuit destruction so that if zero voltage is never actually achieved then the device cannot switch. Other resonant inverters, such as a typical clamped mode resonant pole inverter, can experience overshoot current of more than twice the rated load current.

A resonant snubber inverter circuit currently exists which reduces over-voltage and over-current problems in the circuit. FIG. 1 shows such a three-phase resonant snubber circuit 6 connected in Y configuration for reducing over-voltage and over-current problems in the main inverter circuits 8 without requiring that switching only occur at the zero voltage crossing. This resonant snubber circuit 6 utilizes three antiparallel auxiliary switch pairs 14 & 16, 18 & 20, and 22 & 24 to control the resonance for each phase with each auxiliary switch pair being connected to the center tap of two energy storage capacitors 10 and 12 to provide the snubber voltage, blocking diodes 15, 17, 19, 21, 23, and 25 connected in series with respective auxiliary switches, three high frequency resonant capacitor pairs 44 & 46, 48 & 50, and 52 & 54, and three resonant inductors 26, 28, and 30.

The main switches 32, 34, 36, 38, 40, and 42 control the current flowing to the motor 56. The six auxiliary switches 14–24, in series with their respective reverse blocking diodes 15–25, control snubbing during commutation of the main switches 32–42.

During commutation, resonant snubber inverters of the present type provide soft turn-on of the main switches without means external to the circuit. Without resonant snubbers, when turning on the main switches 32–42, the energy stored in the resonant capacitors 44–54 charges back to the main switches 32–42, and the reverse recovery current caused by the free-wheeling diodes 45–55 adds in, resulting in a large spiky current. The resonant snubber circuit 6 in FIG. 1 solves the turn-on over-current problem. For example, when the motor phase A current is positive and is flowing through the free-wheeling diode 47 which is anti-paralleled against main switch 34, before turning on main switch 32 when main switch 34 is still on, auxiliary switch 16 is turned on and a current flows through the resonant inductor 26 and main switch 34. When this current exceeds the load current, a resonance occurs between the resonant inductor 26 and the resonant capacitors 44 and 46. The resonant current diverts the current from diode 47 against switch 34 to diode 45 against switch 32, resulting in zero voltage across main switch 32. Zero voltage switching can then be achieved.

Although the FIG. 1 resonant snubber inverter allows the main switches to turn on at zero voltage across the main devices, the quantity of components required for this circuit and possible voltage imbalance across capacitors 10 and 12 make its application less desirable.

SUMMARY OF THE INVENTION

The present invention provides a resonant snubber inverter circuit that reduces over-voltage and over-current conditions during switching. In a preferred embodiment, the resonant snubber inverter circuit includes a main inverter circuit having a plurality of main switches, and a resonant snubber circuit having one or more snubber branches. The snubber branches are connected in delta to the main inverter circuit, and each of the branches selectively conducts a resonant current to produces a zero voltage across predetermined ones of the main switches.

The resonant snubber branches may be comprised of several different electronic components in various arrangements. For example, in one embodiment each of the resonant snubber branches includes an inductor connected in series with a semiconductor switch. In another embodiment, each of the resonant snubber circuit branches includes an inductor in series connection with a diode and a semiconductor switch. Bi-directional switches may be used as well.

The resonant snubber inverter circuit may further include sources of capacitance that are connected in parallel with each of the main switches. Each of the main switches supplies current to the resonant snubber circuit branches to produce resonant current. By repetitively charging and discharging the sources of capacitance, the resonant current results in a zero voltage condition being created across the main switches, enabling zero voltage turn-on of the inverter circuit main switches.

In another preferred embodiment of the present invention, a resonant snubber-based, soft switching, multi-phase, inverter circuit is provided for achieving lossless switching of circuit components. Included in this embodiment is a main inverter circuit having a plurality of main switches and sources of capacitance in parallel with the main switches.

The main inverter circuit produces a plurality of current phases. An auxiliary resonant snubber circuit is connected to the inverter circuit in a delta configuration. The snubber circuit includes a plurality of resonant snubber branches for repetitively producing zero voltage across each of the main switches and sources of capacitance. Each of the snubber branches includes an inductor in serial connection with an auxiliary switch. There is a controller for controlling the main and auxiliary switches to achieve lossless switching by switching the auxiliary switches to produce zero voltage conditions across the main switches and by switching the main switches during the zero voltage conditions.

Each of the sources of capacitance may further include capacitance in parallel with each of the main switches. These capacitances are resonated by the snubber branches during turn-on of the main switches.

For each current phase, the inverter circuit may include an upper semiconductor switch and a lower semiconductor switch, each having a source, gate, and drain. The source of the upper semiconductor switch is connected to the drain of the lower semiconductor switch, producing an alternating current phase at the source-drain junction. A reverse blocking diode is antiparalleled against each of the semiconductor switches to allow negative current flow through the switch.

Another preferred embodiment uses a resonant snubber-based, soft switching, single-phase, inverter circuit for achieving lossless switching of circuit components. In this embodiment, there is a main inverter circuit having a plurality of main switches with sources of capacitance connected to the main switches. An auxiliary resonant snubber circuit is connected to the inverter circuit in a delta configuration. The snubber circuit has a single resonant snubber branch for repetitively producing zero voltage across each of the main switches and sources of capacitance. The snubber branch includes an inductor in serial connection with a bi-directional, auxiliary switch. A controller is used to control the main and auxiliary switches to achieve lossless switching by switching the auxiliary switch to produce zero voltage conditions across the main switches and by switching the main switches during these zero voltage conditions.

As an alternative to other preferred embodiments, a resonant snubber-based, soft switching, single-phase, inverter circuit embodiment includes a main inverter circuit and an auxiliary resonant snubber circuit. The main inverter circuit includes a plurality of main switches and sources of capacitance connected to the main switches so as to produce a single alternating current phase. The snubber circuit is connected to the main inverter circuit in a delta configuration and includes two resonant snubber branches for repetitively producing zero voltage across each of the main switches and sources of capacitance. Each snubber branch includes an inductor and one auxiliary switch connected in series with the inductor. A controller controls the main and auxiliary switches to achieve lossless switching.

Each of the resonant snubber branches may further include a reverse blocking diode. With the resonant branches connected in parallel, the diode are oppositely oriented so that one diode blocks voltage in one direction and the other diode blocks voltage in the opposite direction.

A method is disclosed by the present invention for achieving lossless resonant snubbing during switching of an inverter circuit. The inverter circuit includes a first upper main switch in serial connection with a first lower main switch, and a second upper main switch in serial connection with a second lower main switch with each of the main switches having a parallel capacitance associated with the switch. The method includes the steps of turning on the first lower main switch and second upper main switch so that the first lower and second upper main switches conduct current. One or more resonant snubber branches are provided with each of the branches being connected in a delta configuration at junctions between the upper and lower main switches. A predetermined auxiliary switch located within a resonant snubber branch is turned on, producing increasing current flows in the resonant snubber branch and decreasing voltage across the first lower and second upper main switches. The first lower and second upper main switches are turned off when the voltage across the first lower and second upper switches is zero. This action initiates resonant discharge of the capacitances located in parallel with the first upper and second lower main switches to produce zero voltage across these switches. The first upper and second lower main switches can then be turned on at zero voltage condition.

Another method disclosed by the present invention is a method for achieving lossless resonant snubbing during transition cycle switching of an inverter circuit having a first upper main switch in serial connection with a first lower main switch. The inverter circuit also includes a second upper main switch in serial connection with a second lower main switch. A load is connected to the circuit and drawing a load current. The first upper and second lower main switches are in an initially off state with substantially zero current flow through these switches. The second upper and first lower main switches are in an initially on state with positive current flowing through these switches. Each of the main switches has a parallel capacitance associated with the switch.

For one transition switching cycle, this method includes the steps of providing first and second resonant snubber branches. The first resonant snubber branch includes a first inductor in serial connection with a first diode and a first semiconductor switch. The second resonant snubber branch includes a second inductor in serial connection with a second diode and a second semiconductor switch. The second semiconductor switch is turned on and a substantially linearly increasing current flows through the second inductor while current flowing through the second upper and first lower main switches reduces to zero when the second inductor current equals the load current. The second upper and first lower main switches are turned off when the second inductor current is higher than the load current as the energy stored in the second inductor sufficiently discharges the capacitors across the main switches. This action charges the parallel capacitances associated with the second upper and first lower main switches until the second upper and first lower capacitances conduct current and discharge to zero voltage the parallel capacitances associated with the first upper and second lower main switches. This produces zero voltage across the first upper and second lower main switches. In this way, the parallel capacitances associated with the second upper and first lower main switches allows zero voltage turn-off of the second upper and first lower main switches. The first upper and second lower main switches are turned on at zero voltage. The load current is diverted to antiparalleled diodes associated with the first upper and second lower main switches as the second inductor current decreases linearly. Current is diverted from the antiparalleled diodes associated with the first upper and second lower main switches to the first upper and second lower main switches when the second inductor current equals the load current. This produces linearly increasing current flow through the first upper and second lower main switches. Finally, the second semiconductor switch is turned off when the second inductor current equals zero.

5,710,698

BRIEF DESCRIPTION OF THE DRAWINGS

Relative to the drawings wherein like reference characters designate like or similar elements throughout the several drawing figures:

FIG. 10 is an illustration of the operating mode of the Y-connected, single-phase inverter during time segment $t_4-t_5$ of one transition cycle;

FIG. 11 is an illustration of the operating mode of the Y-connected, single-phase inverter during time segment $t_5-t_6$ of one transition cycle;

FIGS. 12A-F is a timing chart showing the corresponding waveforms for the different operating modes illustrated in FIGS. 6-11;

DETAILED DESCRIPTION OF THE PREFERRED EMBODIMENT

Figure 1:
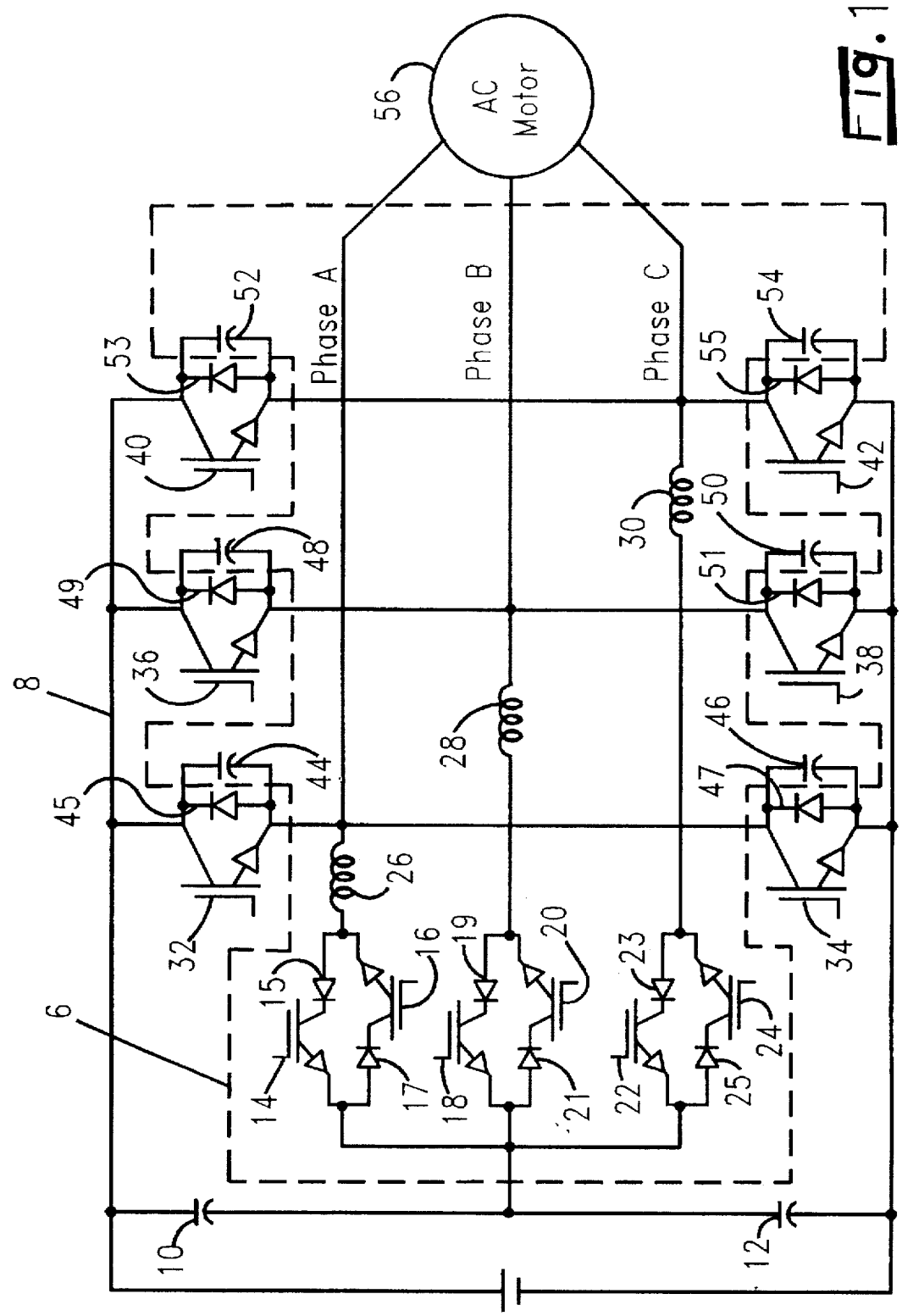
FIG. 1 is a prior art circuit diagram of a three-phase resonant snubber inverter using bi-directional switching in the snubber branches.
Figure 2:
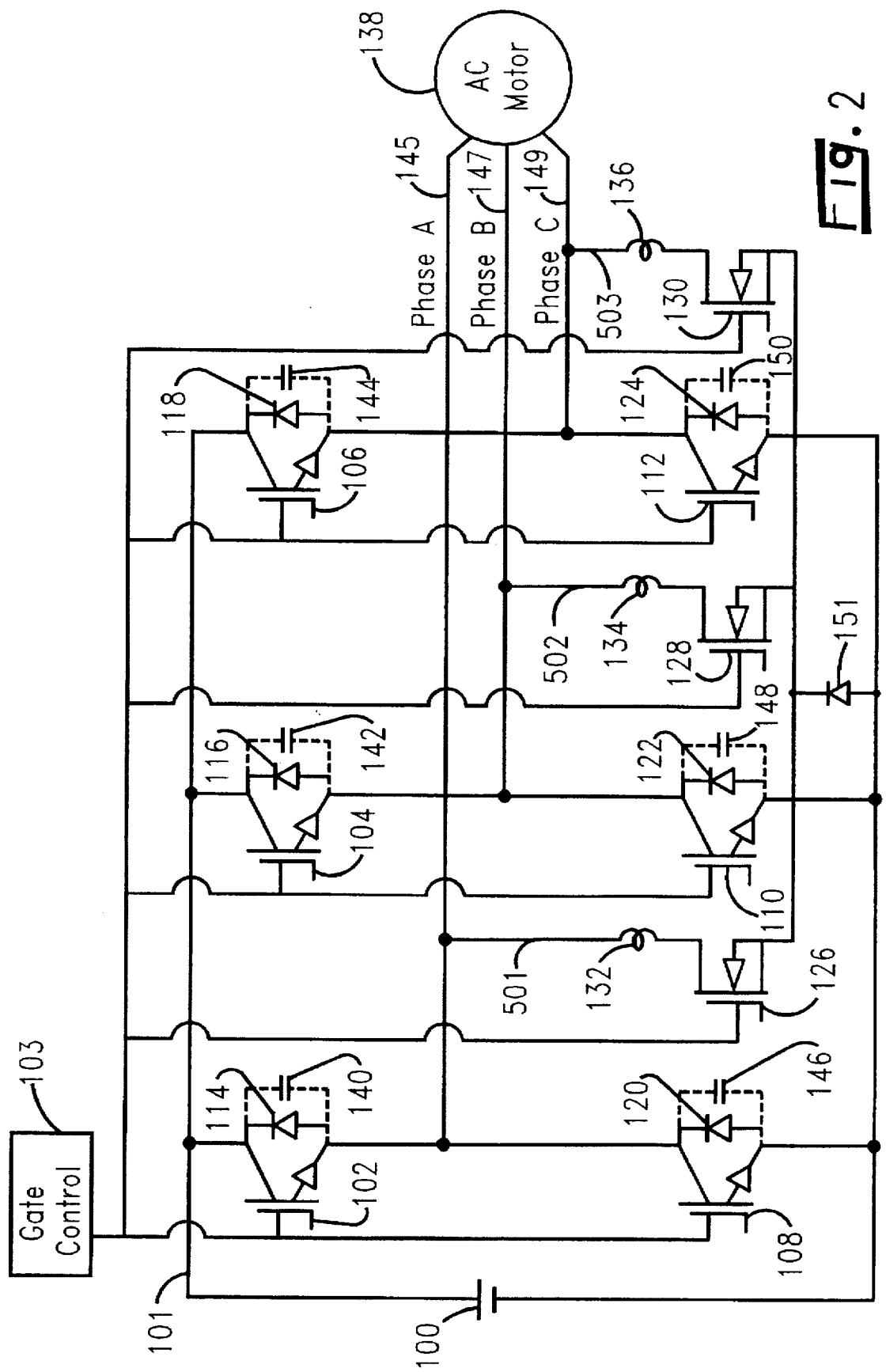
FIG. 2 is a circuit diagram of the Y-connected, three-phase, resonant snubber inverter using insulated gate bipolar transistors as the main switches and power MOSFET devices as the auxiliary switches.
Figure 3:
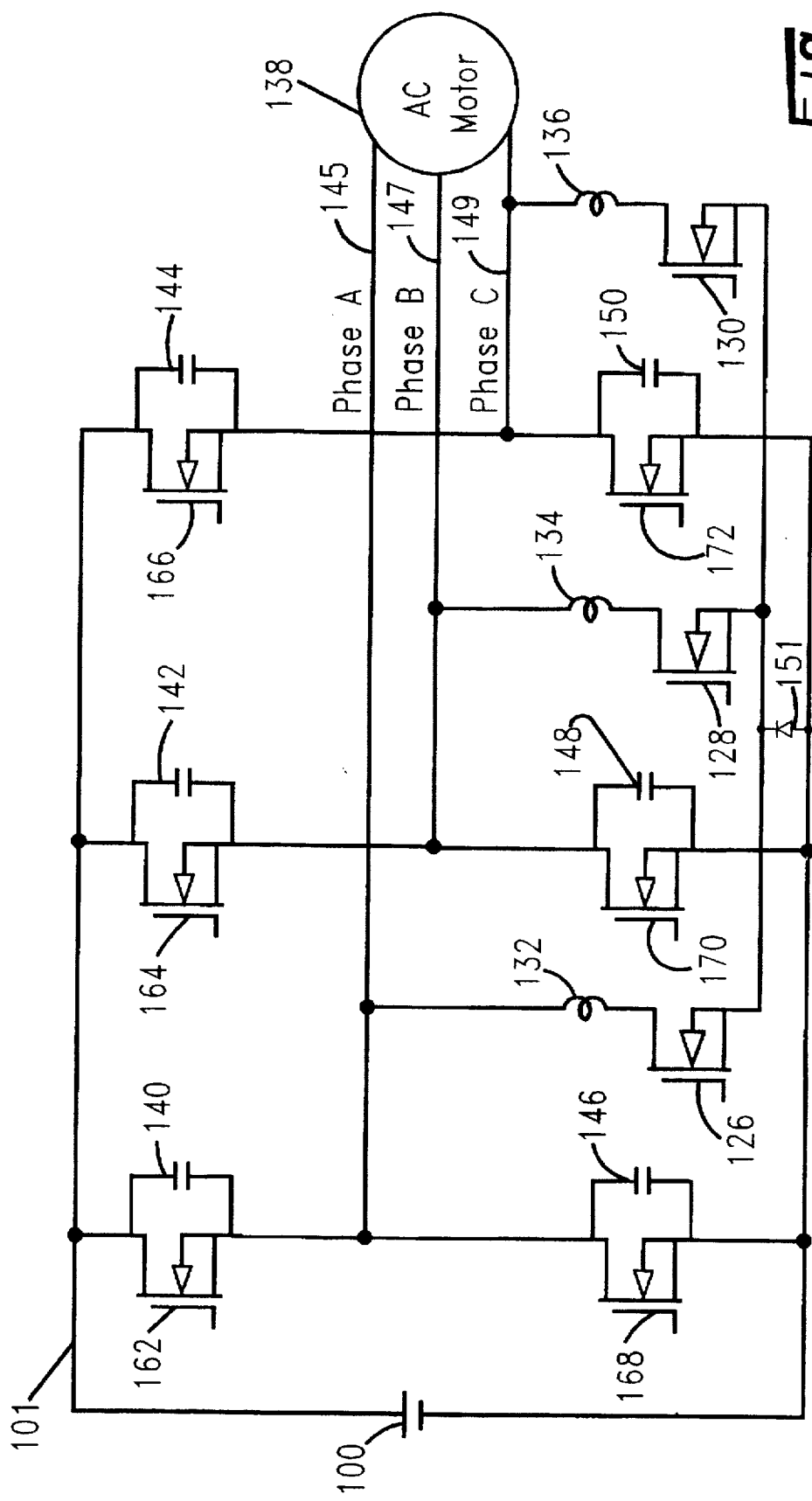
FIG. 3 is a circuit diagram of the Y-connected, three-phase, resonant snubber inverter using power MOSFET devices as the main switches and as the auxiliary switches.

The present invention discloses a resonant snubber circuit that is connected to a main inverter circuit in a Y-configuration, where a common node ties one end of each of the snubber circuit branches together, or in a Δ-configuration, where each branch of the resonant snubber circuit is connected between two inverter output terminals. Preferred embodiments of a Y-connected, resonant snubber circuit are shown in FIGS. 2 & 3. These embodiments differ only by the type of main switch that each employs. The embodiment of FIG. 2 shows a three-phase resonant snubber-based, soft switching inverter circuit 101 with the snubber circuit branches connected in a Y-configuration. This circuit 101 includes a dc voltage source 100, six main switches 102, 104, 106, 108, 110, and 112, six free-wheeling diodes 114, 116, 118, 120, 122, and 124 antiparalleled with the main switches, three auxiliary switches 126, 128, and 130, three resonant inductors 132, 134, and 136, gate control logic 103 for switching the main switches 102–112 and auxiliary switches 126–130, a protective diode 151, and a load, such as a three-phase ac motor 138. Gate control circuitry 103 shown in FIG. 2 is not illustrated in FIG. 3 and subsequent Figures for purposes of clarity. In the preferred embodiments, the main switches 102–112 in FIG. 2 are insulated gate bipolar transistors, and the main switches 162–172 in FIG. 3 are power MOSFET devices. In FIG. 2, each of the six main switches 102–112 is antiparalleled with a reverse blocking diode 114–124. The power MOSFET devices shown in FIG. 3 have inherent diode characteristics which eliminates the need for antiparallel diodes. Capacitors 140, 142, 144, 146, 148, and 150 ideally represent the stray capacitances of the main switches 102–112. These capacitors can also represent real capacitances as needed to compensate for variations in component tolerances. Although not intended as a limitation on possible equivalents of other embodiments, gate control 103 is preferably implemented by utilizing gate drivers and pulse width modulation control techniques.

With continued reference to FIG. 2, the phase A motor lead 145 is connected to the source of main switch 102, the drain of main switch 108, and inductor 132. The phase B motor lead 147 is connected to the source of main switch 104, the drain of main switch 110, and inductor 134. The phase C motor lead 149 is connected to the source of main switch 106, the drain of main switch 112, and inductor 136. Inductor 132 is connected in series with auxiliary switch 126. Inductor 134 is connected in series with auxiliary switch 128. Inductor 136 is connected in series with auxiliary switch 130. The sources of all three auxiliary switches 126, 128, and 130 are connected together. The cathode of protective diode 151 is connected to the sources of all three auxiliary switches 126–130 and the anode of protective diode 151 is connected to the sources of all three lower main switches 108, 110, & 112. This diode 151 reduces voltage spikes which would otherwise occur between upper switch 102–106 and lower switch 108–112 turn-off and turn-on. More specifically, connecting the center point of the Y-connection to the main inverter circuit 101 with the protective diode 151 prevents over-voltage failure of the auxiliary switches 126–130 by preventing the voltage across the auxiliary switches 126–130 from exceeding the voltage supply 100.

A Y-connected, resonant path is established for each phase by use of a resonant inductor/auxiliary switch pair 132 & 126, 134 & 128, and 136 & 130. Each resonant inductor/auxiliary switch pair comprises a snubber branch so that a single snubber branch exists for each current phase, where snubber branch 501 consists of inductor 132 and auxiliary switch 126, snubber branch 502 consists of inductor 134 and auxiliary switch 128, and snubber branch 503 consists of inductor 136 and auxiliary switch 130. Each auxiliary switch is, for example, a power MOSFET device. The power MOSFET switches have inherent diode characteristics to allow current flow in two directions, thereby eliminating the need for antiparallel diodes.

With continued reference to FIG. 2, in operation, each of the three snubber branches 501, 502 and 503 acts to produce zero voltage across the main switches 102–112 during switching by establishing resonance across the main switches 102–112. This enables zero voltage, lossless switching. Each of the snubber branches 501, 502 and 503 operates in conjunction with the main switches to enable resonance to occur. In other words, each snubber branch 501, 502, and 503 depends on the main switches to supply the current needed to establish resonance. For example, when the phase-A current is flowing through diodes 116 and 120 which are antiparalleled against the second upper main switch 104 and the first lower main switch 108 respectively, zero voltage turn-on for first upper main switch 102 and second lower main switch 110 is achieved by turning on auxiliary switch 128 which creates a current path through main switch 104, inductor 134, auxiliary switch 128, auxiliary switch 126, inductor 132, and main switch 108. The supply voltage 100 is now fully charging through this current path, and the current through inductor 134 is linearly increased. When the inductor current is larger than the load current, a resonance occurs that discharges stray capacitors 140 & 148 and charges stray capacitors 142 & 146. When the voltage across stray capacitors 140 and 148 discharges resonantly to zero, main switches 102 and 110 are then switched at zero voltage condition. The same procedure is also used for the other switches.

The topology of the present invention fully utilizes the main switches and their stray capacitances to achieve zero voltage switching. The stray capacitance, which traditionally introduces large amounts of turn-on current to the device, is now used as the resonant capacitor. As a result, the number of circuit components in this topology is reduced over the prior art while the zero voltage switching property is maintained. However, variations in component values may require the use of real capacitors in order to achieve a sharper zero voltage switching condition. The addition of external capacitors acts to slow down the voltage rise rate during turn-off so that any turn-off loss can be reduced and turn-off voltage spikes eliminated. Thus, in an alternate embodiment using real components, capacitors 140–150 represent stray capacitances plus real capacitances. Although the three auxiliary switches 126–130 are needed to produce the resonant paths, their size can be much smaller than the main switches because their duty cycle is very small, typically less than five percent.

Figure 4:
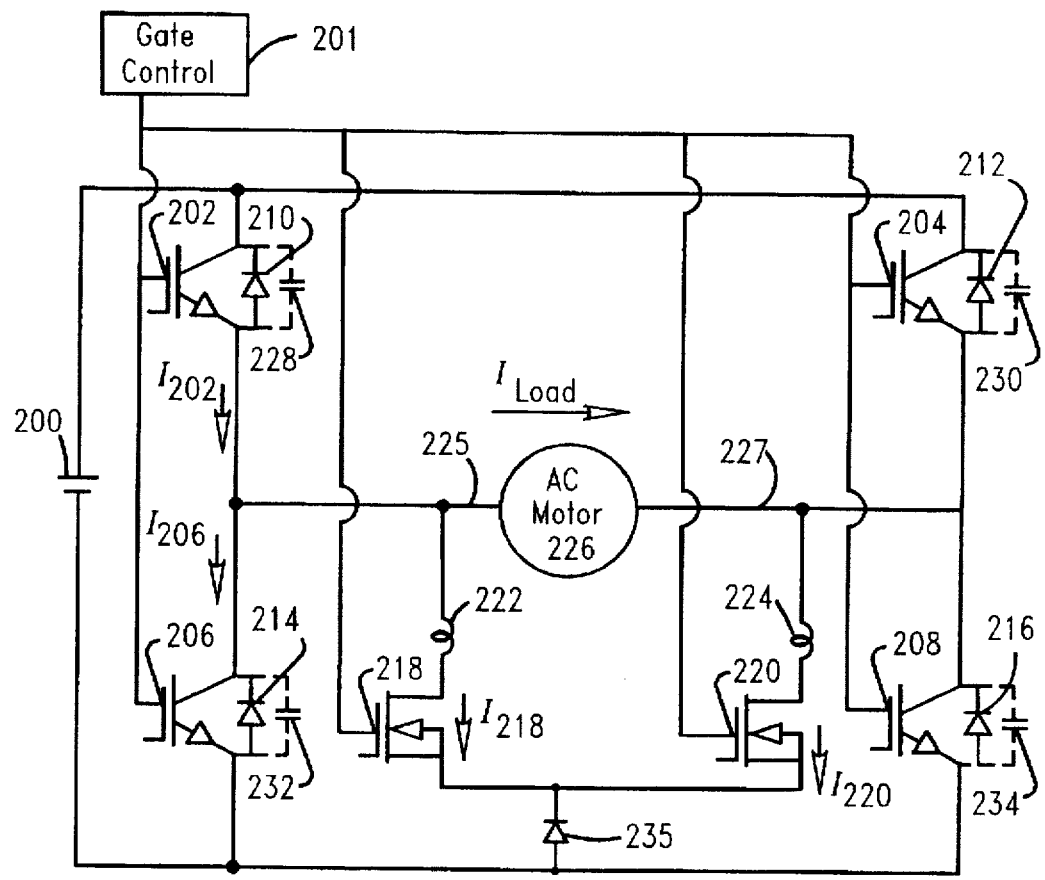
FIG. 4 is a circuit diagram of the Y-connected, single-phase, resonant snubber inverter using insulated gate bipolar transistors as the main switches and power MOSFET devices as auxiliary switches.

There is shown in FIG. 4 a single-phase embodiment of the invention with the snubber circuit branches connected in a Y-configuration. This circuit configuration consists of a dc power source 200, four main switches 202, 204, 206, and 208, four reverse blocking diodes 210, 212, 214, and 216, two auxiliary switches 218 and 220, two resonant inductors 222 and 224, gate control logic 201 for switching the main switches 202–208 and auxiliary switches 218 and 220, a protective diode 235, and a single-phase motor 226. Insulated gate bipolar transistors, for example, are used for each of the four main switches 202–208, and each main switch 202–208 is antiparalleled with a reverse blocking diode 210–216. Capacitors 228, 230, 232, and 234 represent the stray capacitances of the main switches 202–208. Variations in component tolerances may require the addition of real capacitors in parallel with the stray capacitances to reduce voltage rise rate and eliminate voltage spikes during turn-off. Thus, in an alternate embodiment using real components, capacitors 228–234 represent stray capacitances plus real capacitors.

Figure 5:
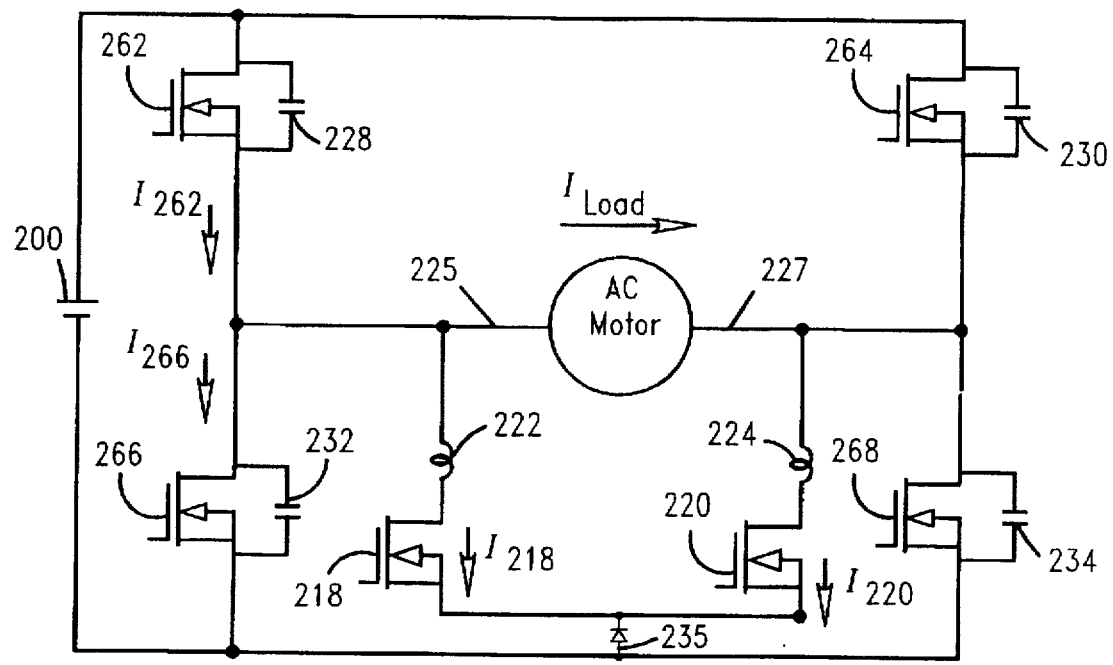
FIG. 5 is a circuit diagram of the Y-connected, single-phase, resonant snubber inverter using power MOSFET devices as the main switches and as the auxiliary switches.

FIG. 5 shows a single-phase embodiment of the present invention with power MOSFET devices used as the main switches 262–268. The power MOSFET devices have inherent diode characteristics and eliminate the need for antiparallel diodes.

The resonant snubber circuit of the single-phase embodiment shown in FIG. 4 is comprised of the two resonant inductors 222 and 224, the two auxiliary switches 218 and 220, and resonant capacitors 228–234. Each auxiliary switch is, for example, a power MOSFET device. One motor lead 225 is connected to the source of main switch 202, the drain of main switch 206, and one side of inductor 222. The other motor lead 227 is connected to the source of main switch 204, the drain of main switch 208, and one side of inductor 224. The other side of inductor 222 is connected to the drain of auxiliary switch 218. The other side of inductor 224 is connected to auxiliary switch 220. The sources of auxiliary switches 218 and 220 are connected to each other. One terminal of the dc power source 200 is connected to the drains of main switches 202 and 204. The other terminal of the power source 200 is connected to the sources of main switches 206 and 208. The cathode of protective diode 235 is connected to the sources of auxiliary switches 218 and 220 and the anode of protective diode 235 is connected to the sources of main switches 206 and 208.

Lossless switching of the main switches 202–208 is achieved by creating zero voltage across the resonant capacitors 228–234, which in turn requires activation of auxiliary switches 218 and 220. To activate these auxiliary switches, a gate voltage is applied for a very short duration; for example—three microseconds. For a 60 hertz circuit output, one cycle equals 16.7 milliseconds; therefore, a three microsecond pulse is of relatively short duration. During this three microsecond transition cycle, current is built up linearly through the auxiliary switch 218 or 220 to twice the load current, resonance occurs, and the main switch 202–208 is switched at zero voltage. The sequence of events can be best illustrated by reference to the current flow arrows $I_{202}$ and $I_{206}$ shown in FIG. 4. These arrows indicate nominal current directions. For an initially positive load current, the operating modes for turning on main switch 202 at zero voltage condition are illustrated in FIGS. 6–11. These figures progressively illustrate the sequence of events for turning on main switch 202 in FIG. 4. FIGS. 12A–F show shows the corresponding waveforms for the different operating modes of FIGS. 4–9, where $t_1$–$t_6$ represents a three microsecond transition cycle and where:

$I_{220}$=current through auxiliary switch 220

$I_{Load}$=current through the load 226

$I_{202}$=current through main switch 202

$I_{206}$=current through main switch 206

$I_{228}$=current through resonant capacitor 228

$I_{232}$=current through resonant capacitor 232

$Vg_{206}$=pulse width modulated gate voltage of main switch 206

$Vg_{202}$=pulse width modulated gate voltage of main switch 202

$Vg_{220}$=gate voltage of auxiliary switch 220

$Vds_{202/208}$=drain to source voltage for main switches 202 and 208.

All unmarked arrows shown in FIGS. 6–11 indicate normal current flows during the represented time frames.

Figure 6:
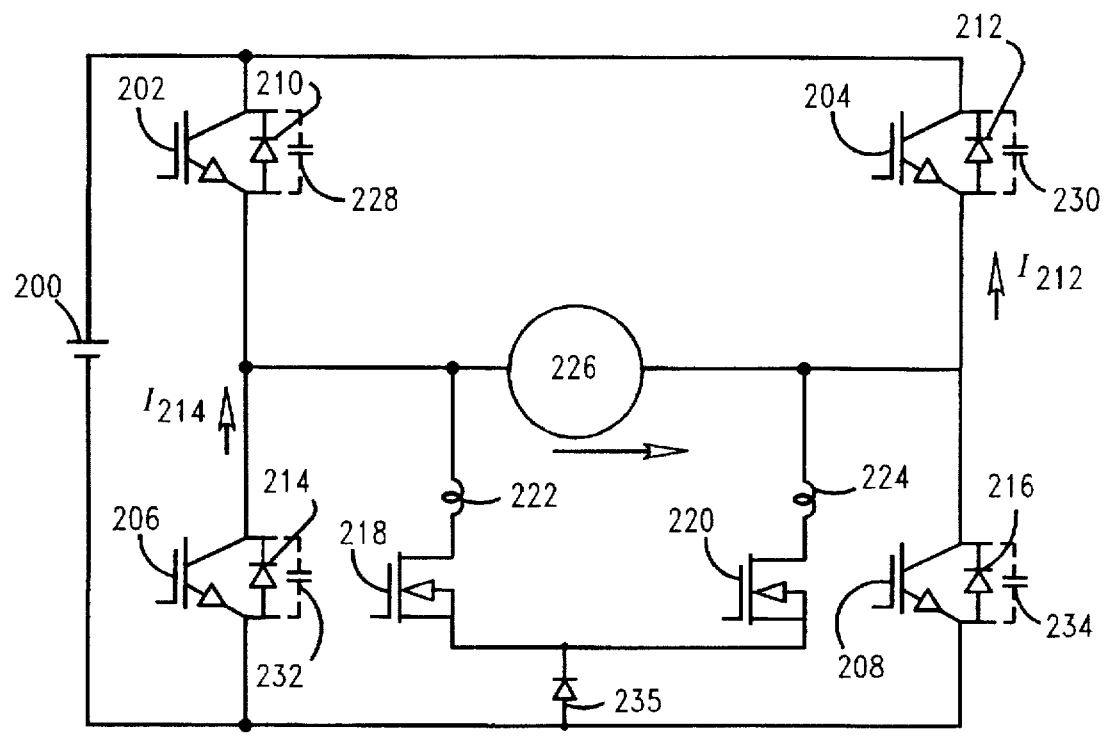
FIG. 6 is an illustration of the operating mode of the Y-connected, single-phase inverter during time segment $t_0-t_1$ of one transition cycle.

With continued reference to FIGS. 6–12F, the different operating modes for a transition cycle ($t_1$–$t_6$) that turns on and off the auxiliary switch 220 and turns on main switch 202 can be described. FIG. 6 shows the initial condition whereby a positive load current $I_{212}$ and $I_{214}$ is freewheeling through diodes 212 and 214 with main switches 204 and 206 remaining on.

Figure 7:
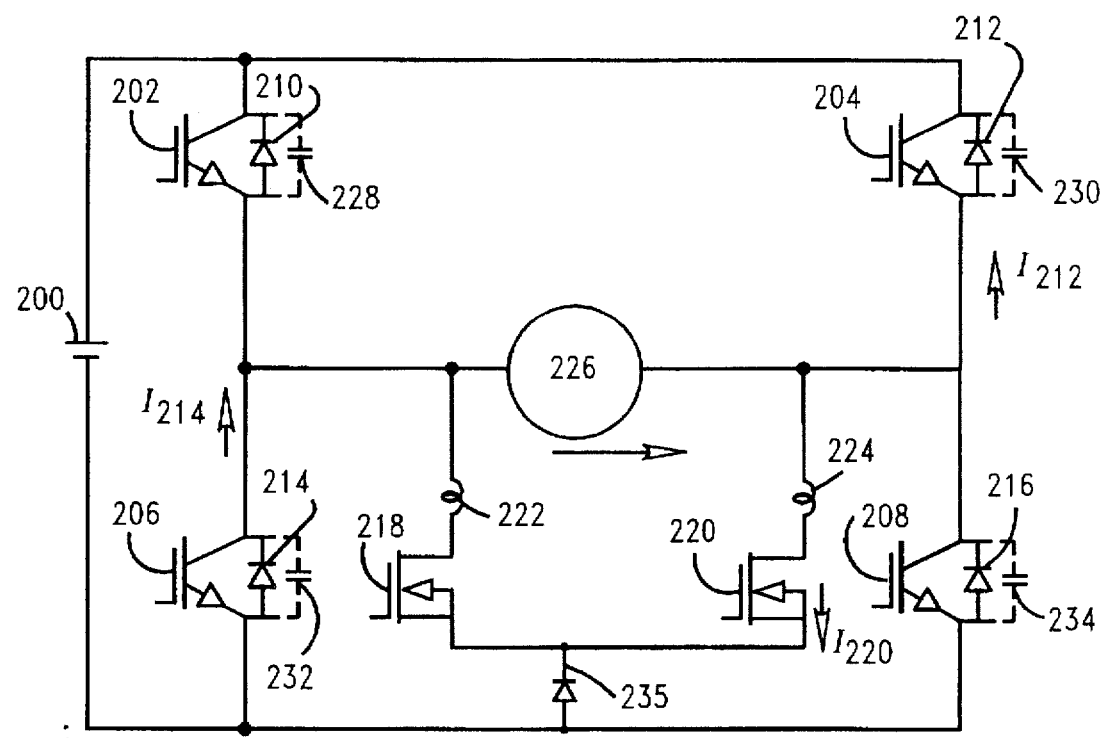
FIG. 7 is an illustration of the operating mode of the Y-connected, single-phase inverter during time segment $t_1-t_2$ of one transition cycle.

In FIG. 7, at time $t_1$, auxiliary switch 220 is turned on. The resonant inductor 224 current is built up linearly. The current $I_{212}$ and $I_{214}$ in main switches 204 and 206 gradually reduces to zero at time $t_2$ when the resonant inductor 224 current $I_{220}$ equals the load 226 current.

Figure 8:
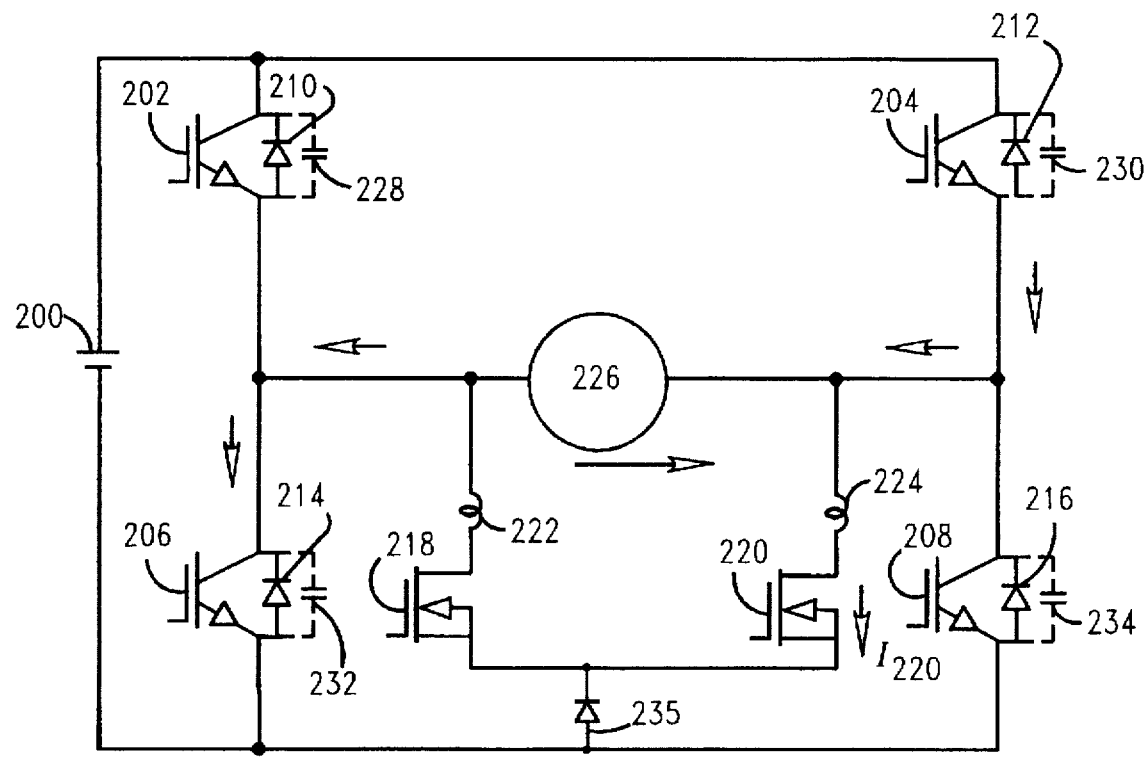
FIG. 8 is an illustration of the operating mode of the Y-connected, single-phase inverter during time segment $t_2-t_3$ of one transition cycle.

In FIG. 8, the inductor 224 current $I_{220}$ exceeds the load 226 current at $t_2$. When the resonant current $I_{220}$ reaches a current that has sufficient energy to charge and discharge capacitors 228, 230, 232, and 234 at $t_3$, main switches 204 and 206 turn off. Capacitors 230 and 232 serve as lossless snubbers to allow zero voltage turn-off.

Figure 9:
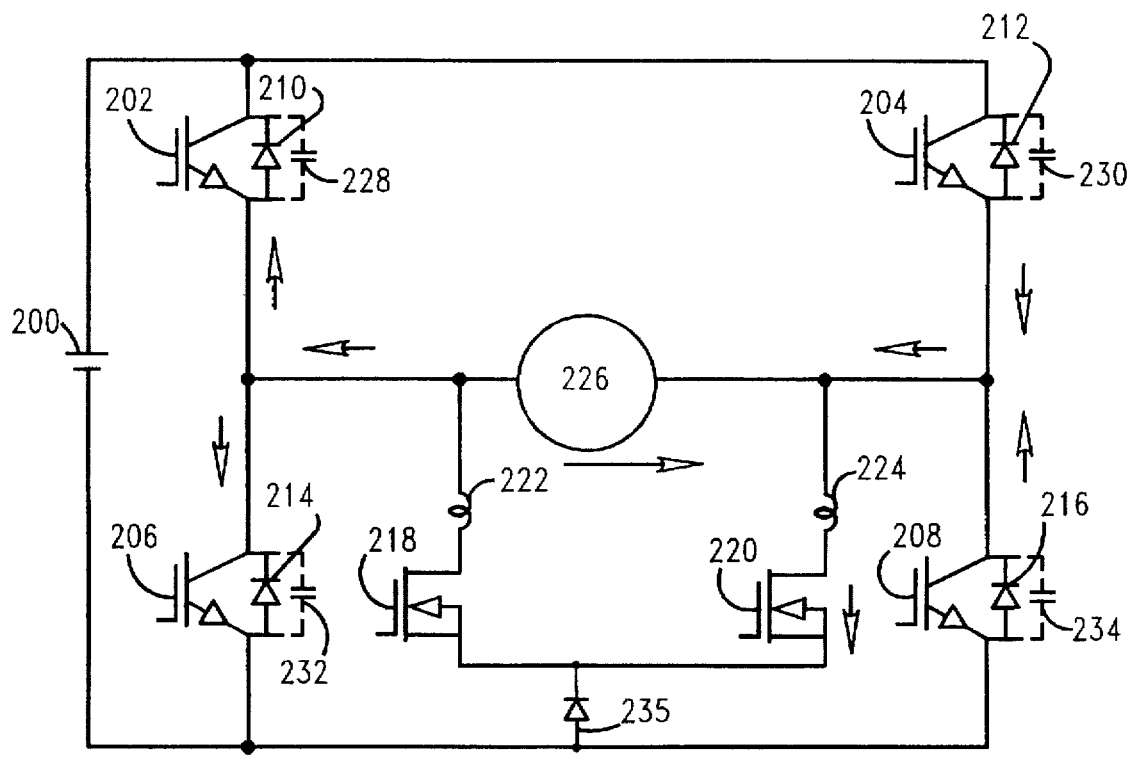
FIG. 9 is an illustration of the operating mode of the Y-connected, single-phase inverter during time segment $t_3-t_4$ of one transition cycle.

In FIG. 9, the resonant capacitors 228 and 234 conduct at time $t_3$. Capacitors 230 and 232 are charged to full voltage, and capacitors 228 and 234 are discharged to zero voltage at $t_4$.

In FIG. 10, the resonant current $I_{220}$ starts decreasing, and the load 226 current is diverted to diodes 210 and 216. Main switches 202 and 208 are turned on at zero voltage condition. At time $t_5$, the resonant current $I_{220}$ through inductor 224 equals the load 226 current, and the diode currents are diverted to main switches 202 and 208.

In FIG. 11, the resonant current through inductor 224 keeps decreasing, and the main switch current is increased linearly. At time $t_6$, the resonant current $I_{220}$ drops to zero, and the auxiliary switch 220 is turned off at zero current condition.

The switching methodology for a three-phase embodiment is similar to the single-phase embodiment of the invention in that switching of the main switches can occur within a three microsecond transition cycle.

This resonant soft switching inverter circuitry uses fewer components in the auxiliary snubber branches of the circuit than other resonant soft switching inverters. Reduced component count translates to reduced costs which makes application of this invention highly desirable. Single-phase and three-phase dc-to-ac power conversion embodiments of the invention do not constitute an exhaustive list. It is contemplated that the invention may be embodied in any application which may utilize resonant soft switching.

Figure 13:
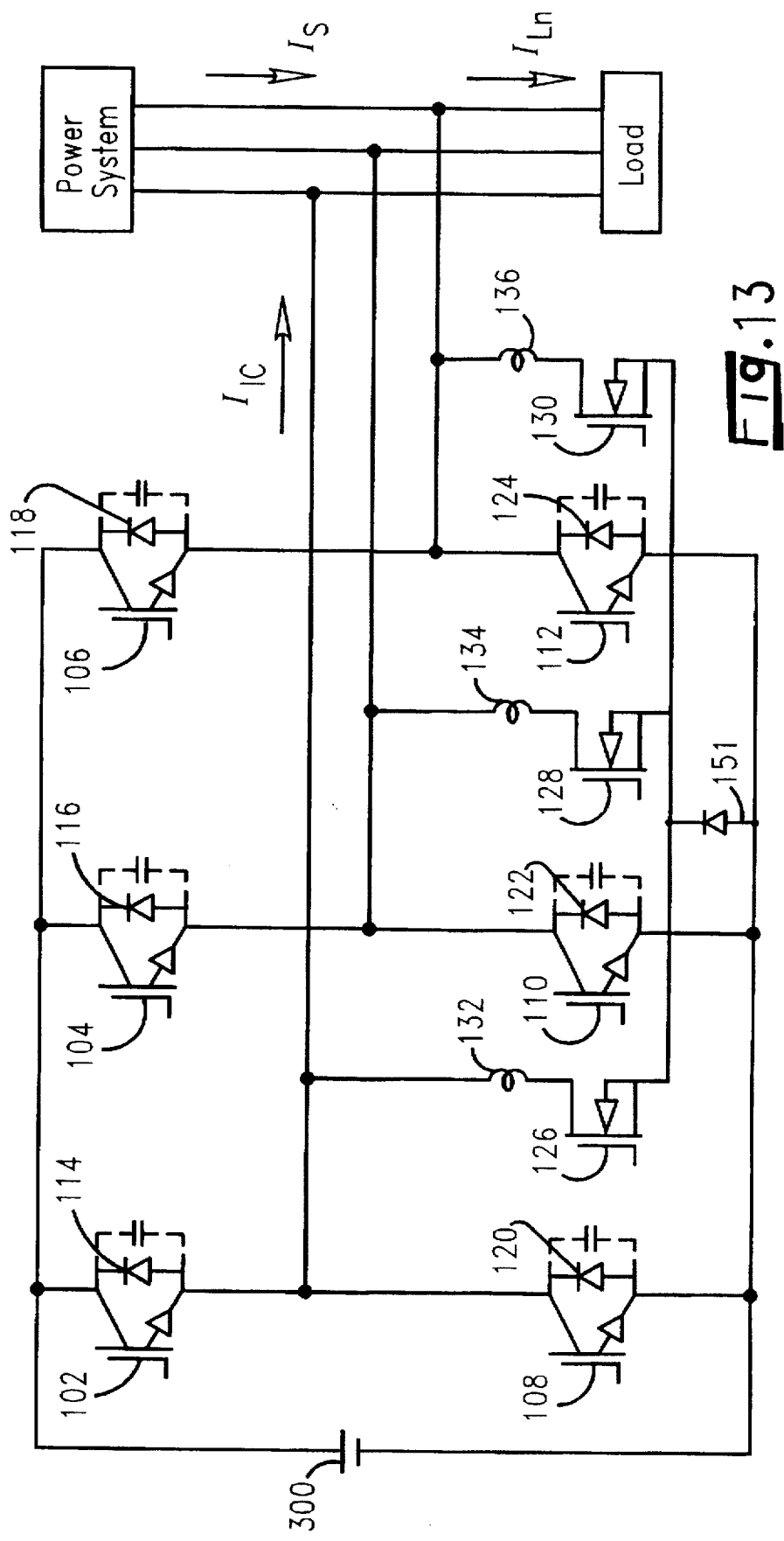
FIG. 13 is a circuit diagram of the Y-connected, three-phase, resonant snubber inverter configured for active harmonic filtering and reactive power compensation applications.

FIG. 13 shows an application of the invention for three-phase active harmonic filtering and reactive power compensation. This topology is essentially the same as for the three-phase ac-to-dc converter application except the dc power source 100 of FIGS. 2 & 3 is replaced with a capacitor 300. When all switches are turned off, capacitor 300 gets charges from diodes 114–124.

With continued reference to FIG. 13, instead of drawing sinusoidal current $I_S$, ac loads can sometimes draw lagging or nonsinusoidal currents. For lagging current $I_{LN}$, reactive power compensation is required. For nonsinusoidal currents $I_{LN}$, harmonic filtering is required. The configuration of FIG. 13 performs both functions. To compensate for nonsinusoidal or lagging current $I_{LN}$ on phase A, main switch 102 is turned on to create positive injecting current shown by $I_{IC}$, and main switch 108 is turned on to create negative injecting current. This procedure is followed by the other two main switch pairs 104 & 110 and 106 & 112 as well to ensure the current on the power system side is always sinusoidal and in phase with the system voltage. The auxiliary switch and inductor pairs 132 & 126, 134 & 128, and 136 & 130 provide soft switching of the main switches 102–112 as previously discussed.

Figure 14:
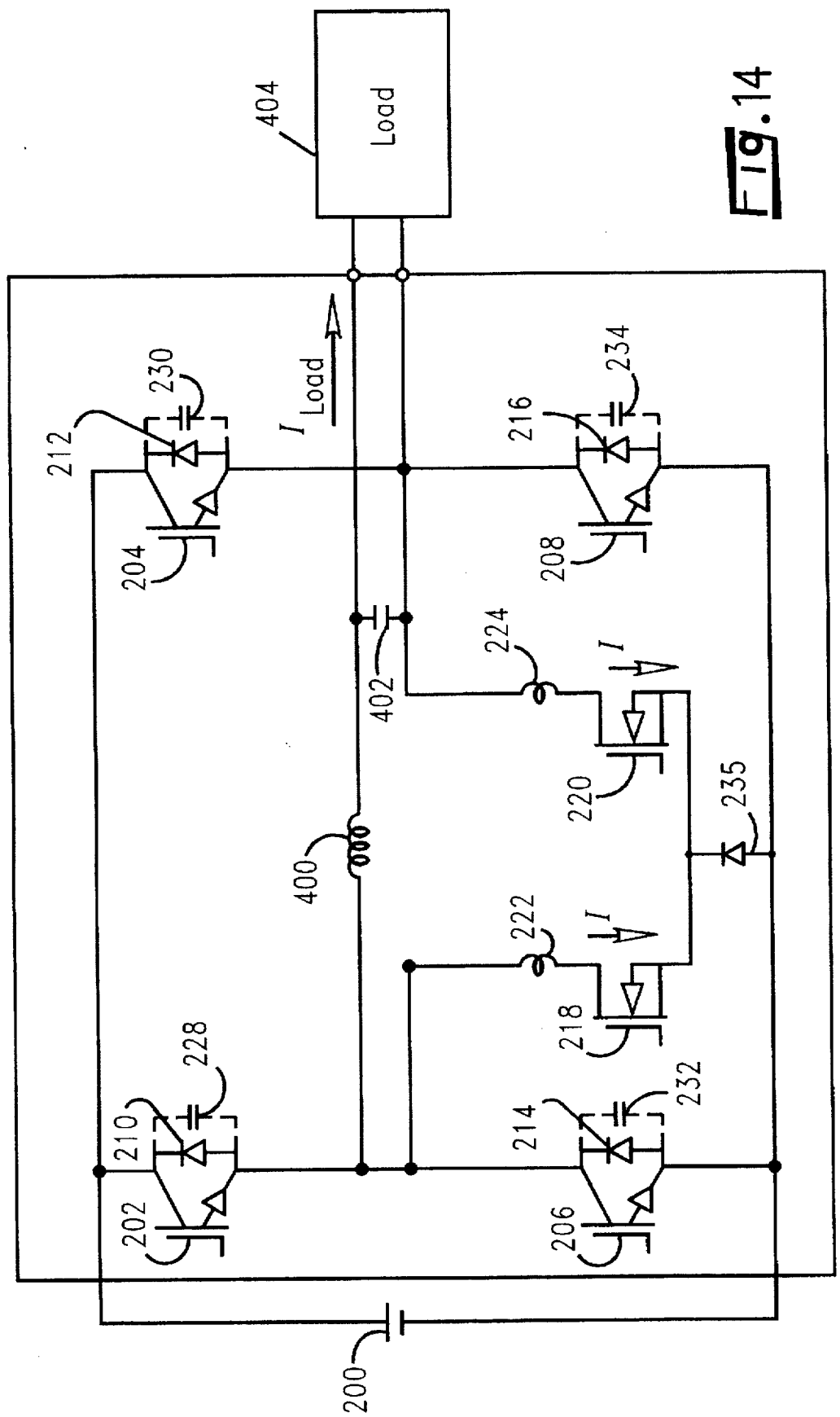
FIG. 14 is a circuit diagram of the Y-connected, single-phase, resonant snubber inverter configured for uninterruptible power system applications.

FIG. 14 shows an application of the resonant snubber based inverter for an uninterruptible power system. This topology is essentially the same as for the single-phase dc-to-ac conversion shown in FIG. 4 except an inductor 400 and a capacitor 402 are added to obtain smooth output voltage. The load 404 can be any appliance or electronic equipment, such as a computer or copy machine. The present invention is an attractive feature in this application because the efficiency improvement extends the battery life of the equipment's run time after main power outage.

FIGS. 15–27 illustrates various embodiments of the present invention with the resonant snubber branches connected to the main inverter circuit in a delta (Δ) configuration. These embodiments differ from the Y-connected embodiments of FIGS. 2–14 in that each branch of the Δ-connected, resonant snubber circuit is connected between two inverter output terminals instead of the branches being connected at a common node. The main inverter circuits of these embodiments are the same as those described with respect to Y-connected embodiments. As previously described, a protective diode 151 (FIG. 2) tying the center point of the Y-connection to the main inverter circuit is needed to eliminate voltage floating problems associated with the Y-connected embodiments. The Δ-connected embodiments illustrated herein exhibit no voltage floating phenomenon and thus, no protective diode is needed. However, in some embodiments the Δ-connection does require a blocking diode in series connection with each auxiliary switch to prevent reverse voltage breakdown. If the auxiliary switch has built-in reverse blocking capability, then the blocking diode is not needed.

Figure 15:
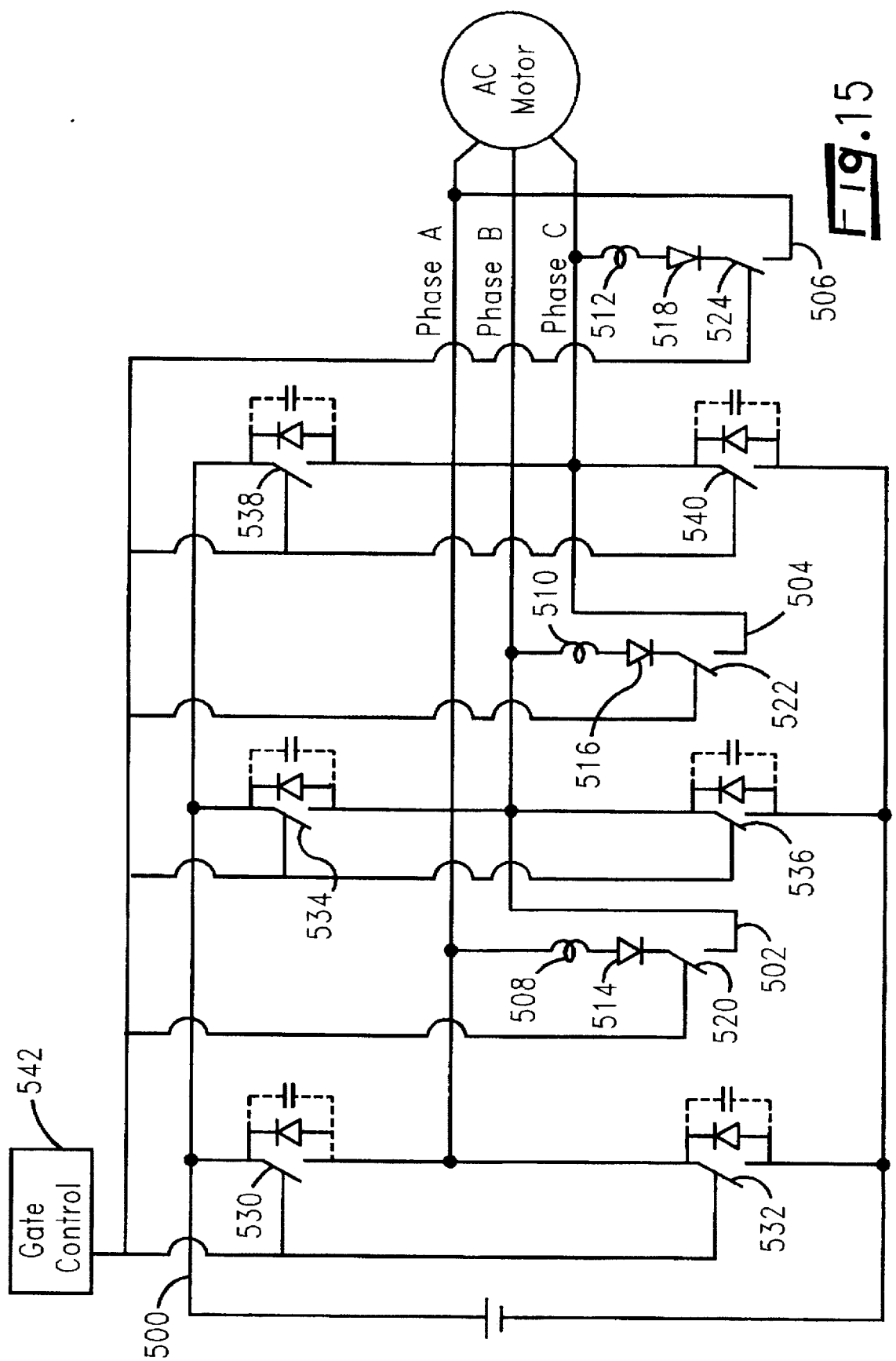
FIG. 15 is a circuit diagram of the Δ-connected, three-phase, resonant snubber inverter using single directional, semiconductor devices as the auxiliary switches.

FIG. 15 illustrates a Δ-connected, resonant snubber inverter circuit 500 for a three-phase motor drive. In a preferred embodiment, main switches 530, 532, 534, 536, 538, and 540 are semiconductor switches having a source, gate, and drain with the source of each main upper switch 530, 534, 538 connected to the drain of a corresponding main lower switch 532, 536, 540. An alternating current phase is produced at each source-drain junction. For example, phase A current is produced at the source-drain junction between upper switch 530 and lower switch 532; phase B current is produced at the source-drain junction between upper switch 534 and lower switch 536; and phase C current is produced at the source-drain junction between upper switch 538 and lower switch 540.

Each of the snubber branches 502, 504, and 506 is connected between two main inverter circuit output terminals, or phases. For example, snubber branch 502, which includes an inductor 508 in series connection with a blocking diode 514 and an auxiliary switch 520, is connected between the phase A and phase B outputs. Snubber branch 504, which includes inductor 510 in series connection with blocking diode 516 and auxiliary switch 522, is connected between the phase B and phase C outputs. Similarly, snubber branch 506, which includes an inductor 512 in series connection with blocking diode 518 and auxiliary switch 524, is connected between the phase C and phase A outputs. The functioning of the three snubber branches 502–506 is the same as previously described with respect to Y-connected embodiments in that each snubber branch 502–506 acts to produce zero voltage across the main switches 530–540 during switching by establishing resonance across the main switches 530–540, thereby enabling zero voltage, lossless switching.

Each of the main switches 530, 532, 534, 536, 538, and 540 and auxiliary switches 520–524 are controlled by gate control logic 542 (not shown in FIGS. 16–27 for purposes of clarity). Main switches 530–540 are preferably power switching devices such as power MOSFET, Insulated Gate Bipolar Transistor (IGBT), and MOS Controlled Thyristor (MCT).

Figure 16:
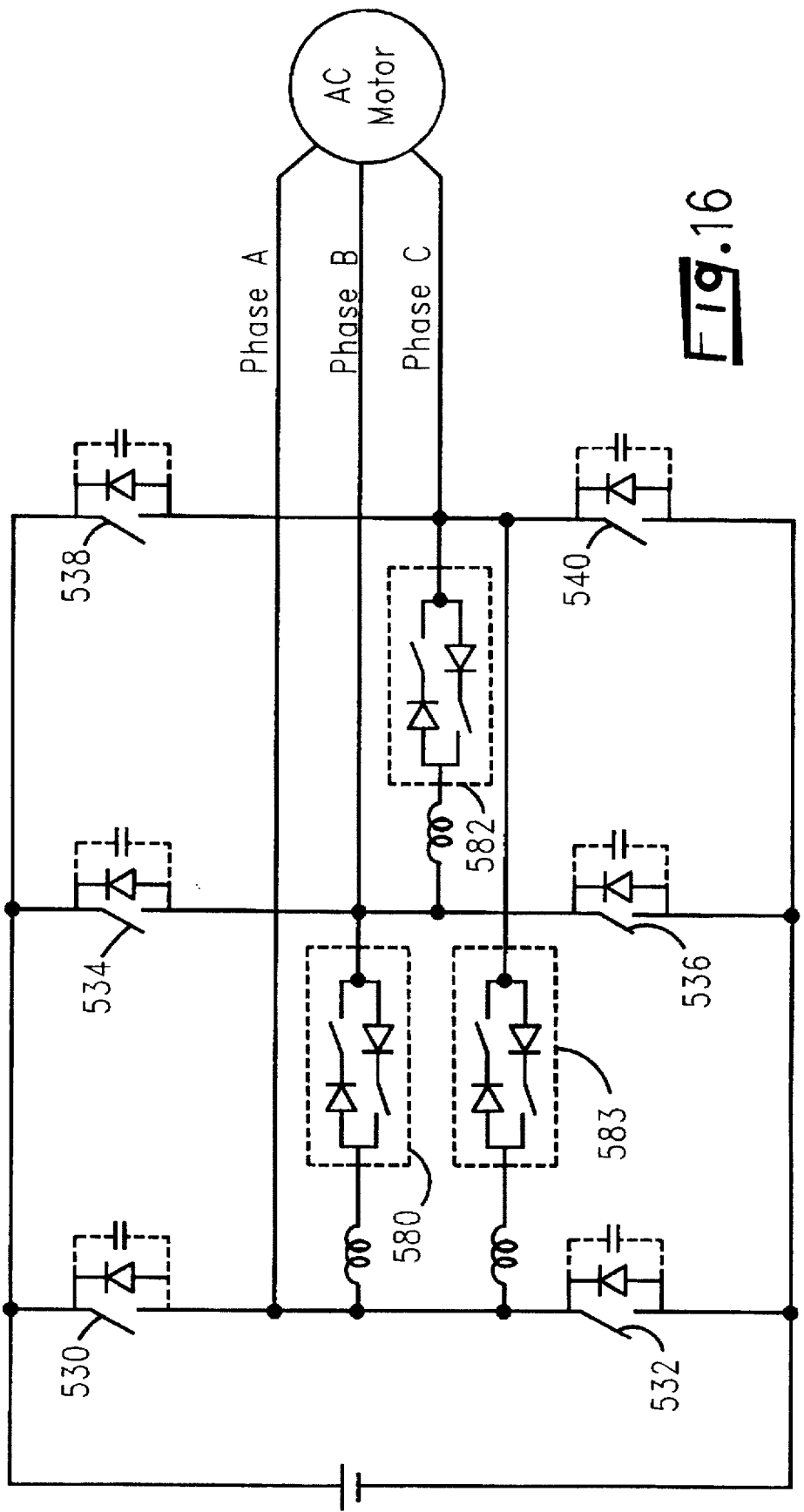
FIG. 16 is a circuit diagram of the Δ-connected, three-phase, resonant snubber inverter using bi-directional, semiconductor devices as the auxiliary switches.

FIG. 16 illustrates a three-phase, Δ-connected embodiment with bi-directional switches 580, 582, and 584 having built-in reverse blocking capability used for resonant branch control. These switches 580–584 conduct current and block reverse voltage in both directions. Alternatively, if the bi-directional switch does not have built-in reverse blocking capability, diodes may be placed in series with each switch to block the reverse voltage. With today's available devices, the preferred choice of bi-directional switch is a power switching device such as power MOSFET, Insulated Gate Bipolar Transistor (IGBT), or MOS Controlled Thyristor (MCT). Although typically more expensive, the bi-directional switch provides greater controllability because they can be turned on and off in both current flow directions.

Figure 17:
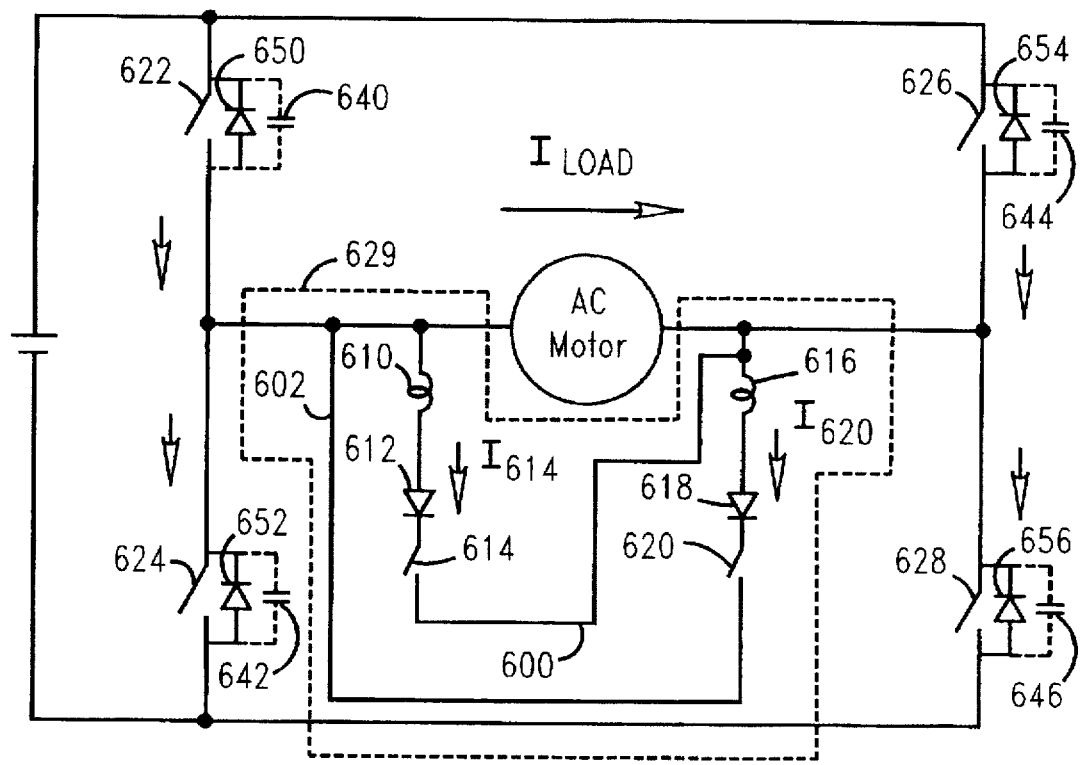
FIG. 17 is a circuit diagram of the Δ-connected, single-phase, resonant snubber inverter using single directional, semiconductor devices as the auxiliary switches.
Figure 18:
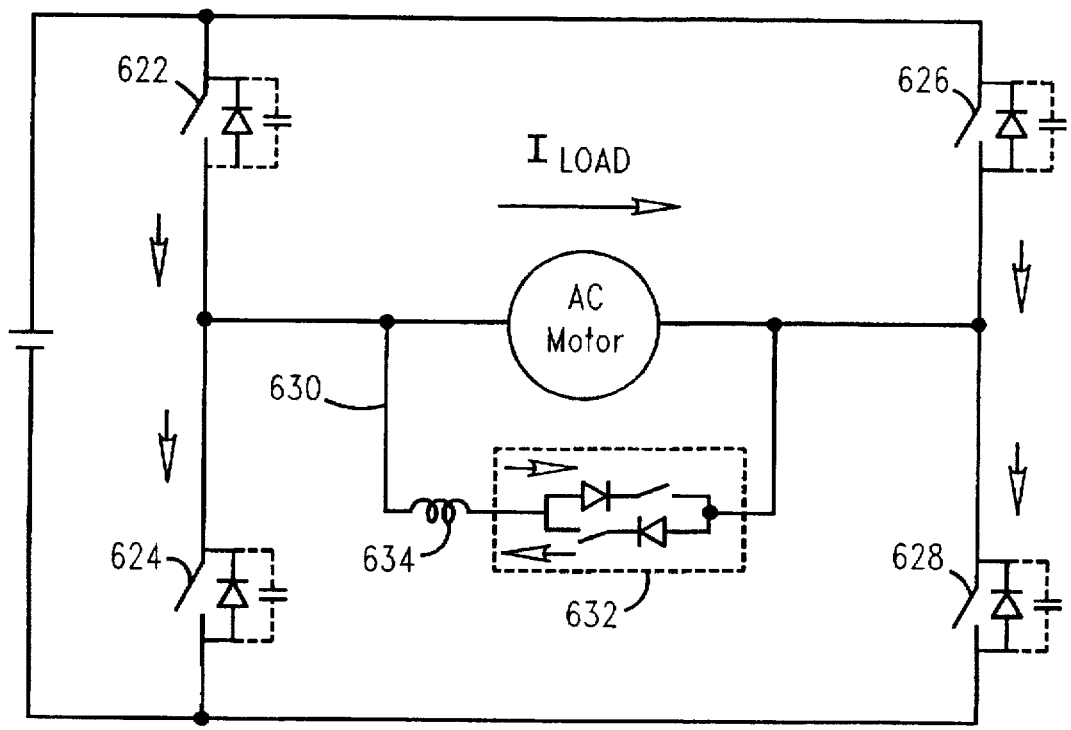
FIG. 18 is a circuit diagram of the Δ-connected, single-phase, resonant snubber inverter using bi-directional, semiconductor devices as the auxiliary switches.

As shown in FIGS. 17 and 18, the Δ-connected, resonant snubber circuit can be configured as a single-phase, full-bridge inverter. The circuit of FIG. 17 has one snubber branch 600, which includes an inductor 610 in series connection with a blocking diode 612 and switch 614, antiparalleled against snubber branch 602, which includes an inductor 616 in series connection with a blocking diode 618 and switch 620. Each of the diodes 612, 618 may be eliminated by employing switches 614, 620 with built-in reverse blocking capability.

The circuit of FIG. 18 has one snubber branch 630 with a single bi-directional, current conducting, voltage blocking switch 632 in series connection with an inductor 634.

Switching logic for the circuits of FIGS. 17 and 18 is the same as that previously described with respect to the single-phase, Y-connected embodiments of FIGS. 4–11 with diagonal switch pairs 622, 628 and 624, 626 turning on and off simultaneously. With reference to FIG. 17, the resonant circuit 629 operates to close auxiliary switch 614 to establish a current $I_{614}$ in inductor 614 before turning off main switches 622 and 628. Similarly, before turning off main switch pair 624, 626 the resonant circuit 629 operates to close auxiliary switch 620 to establish a current $I_{620}$ in inductor 620. Once the inductor current $I_{614}$, $I_{620}$ exceeds the load current $I_{Load}$, the main switch pair 622, 628 and 624, 626 can be turned off. For turning on main switch pair 622, 628, when all of the main switches 622–628 are off (there is a dead time between turning off one pair of switches and turning on the other pair of switches to prevent voltage shoot through), a resonance occurs between the resonant inductor 616 and resonant capacitances 640, 646 that are in parallel with the main switches 622, 628. The voltage polarity on capacitors 640, 646 then reverses and diverts current to diodes 650, 656 that are antiparalleled against the main switches 622, 628. When the antiparalleled diodes 650, 656 conduct, the voltage across the main switches 622, 628 becomes zero, and soft switching of main switches 622, 628 is performed.

FIGS. 19–24 illustrate the resonant operation at different operating modes for one transition switching cycle from turning on to turning off resonant switch 620 shown in FIG. 17, and FIGS. 25A–E show the corresponding voltage and current waveforms for the various operating modes of FIGS. 19–24.

Figure 19:
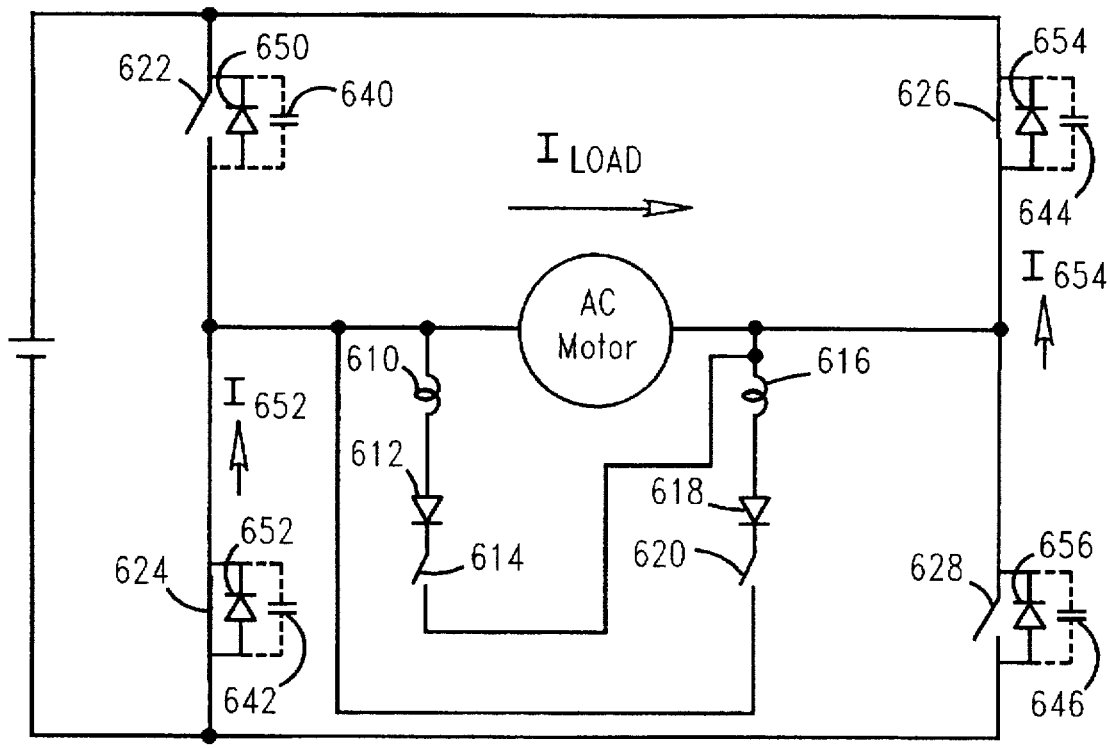
FIG. 19 is an illustration of the operating mode of the Δ-connected, single-phase inverter during time segment $t_0-t_1$ of one transition cycle.

Shown in FIG. 19 is the initial condition whereby a positive load current is free-wheeling through diodes 652, 654 with main switches 626, 624 remaining on.

Figure 20:
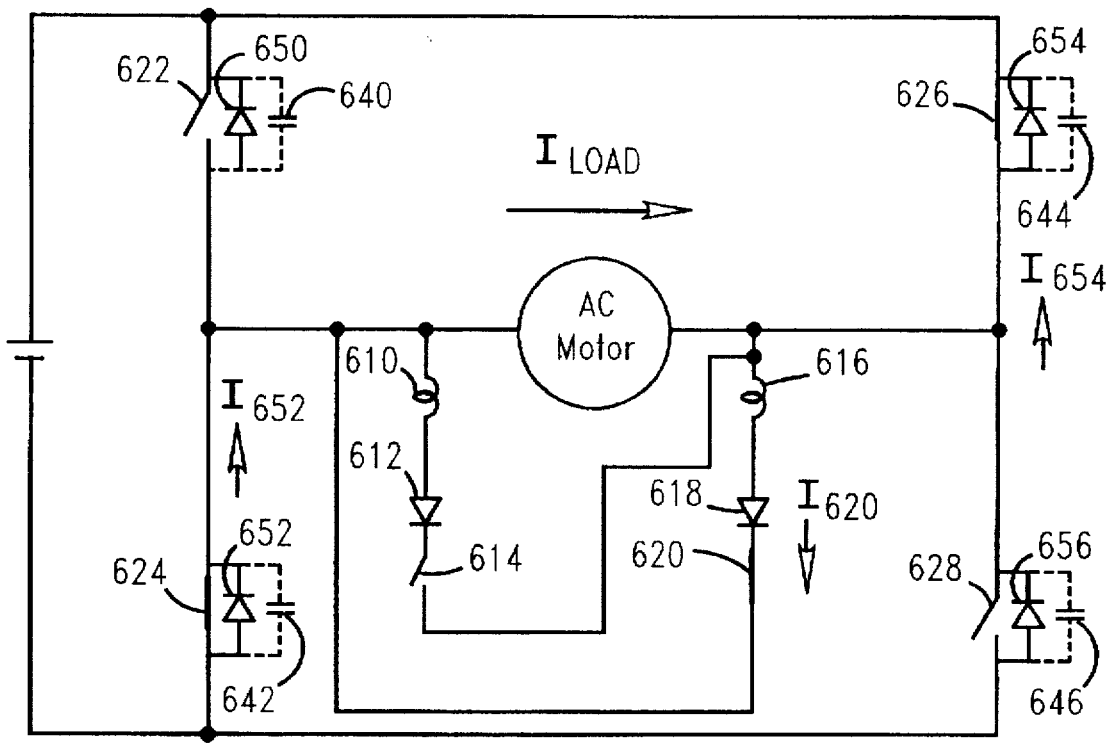
FIG. 20 is an illustration of the operating mode of the Δ-connected, single-phase inverter during time segment $t_1-t_2$ of one transition cycle.

In FIG. 20, at time $t_1$, auxiliary switch 620 is turned on. The resonant inductor 616 current is built up linearly. The current $I_{652}$ and $I_{654}$ in main switches 624 and 626 gradually reduces to zero at time $t_2$ when the resonant inductor 616 current $I_{620}$ equals the load current $I_{LOAD}$.

Figure 21:
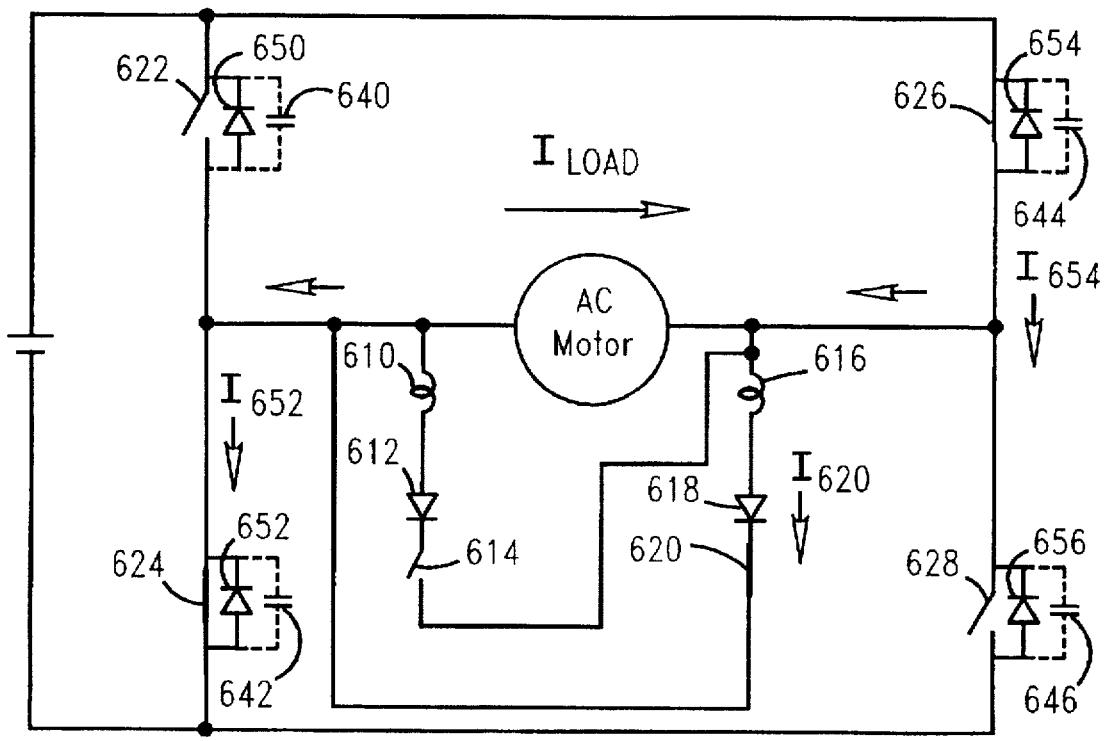
FIG. 21 is an illustration of the operating mode of the Δ-connected, single-phase inverter during time segment $t_2-t_3$ of one transition cycle.

In FIG. 21, the inductor 616 current $I_{620}$ exceeds the load current $I_{LOAD}$ at $t_2$. When the resonant current $I_{620}$ reaches a current level that is sufficient to charge and discharge resonant capacitors 642, 644, 640, and 646, at $t_3$, main switches 624 and 626 turn off. Capacitors 642 and 644 serve as lossless snubbers to allow zero voltage turn-off.

Figure 22:
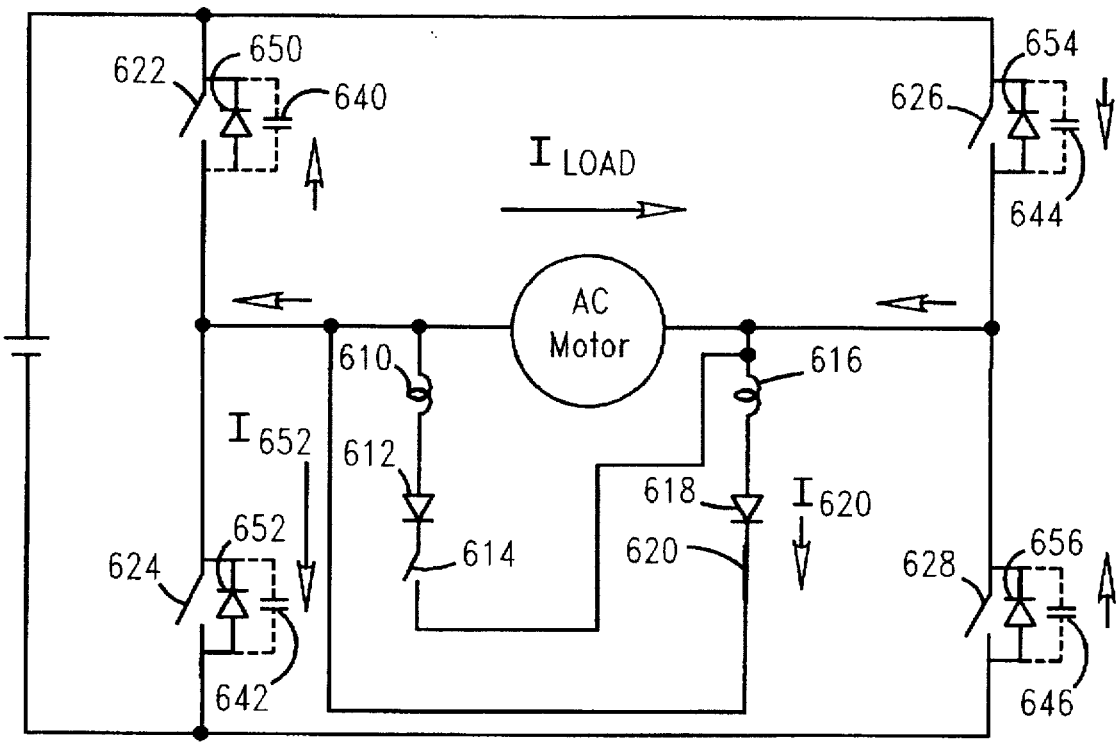
FIG. 22 is an illustration of the operating mode of the Δ-connected, single-phase inverter during time segment $t_3-t_4$ of one transition cycle.

In FIG. 22, the resonant capacitors 640 and 646 conduct at time $t_3$. Capacitors 642 and 644 are charged to full voltage, and capacitors 640 and 646 are discharged to zero voltage at $t_4$.

Figure 23:
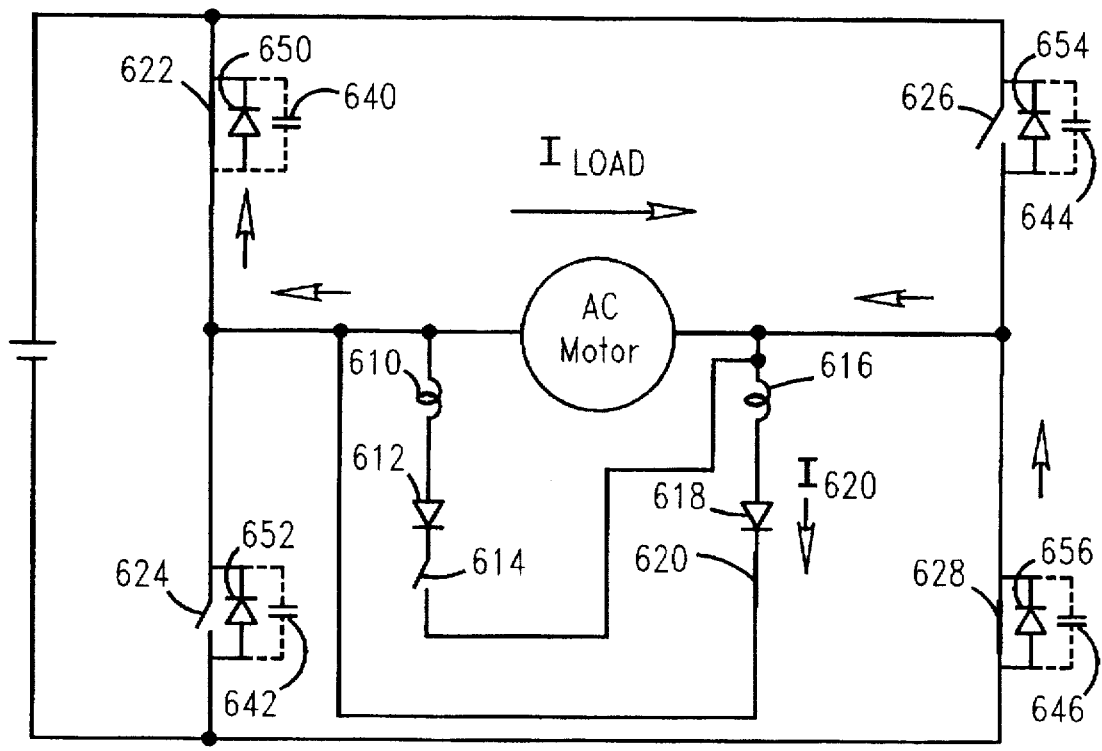
FIG. 23 is an illustration of the operating mode of the Δ-connected, single-phase inverter during time segment $t_4-t_5$ of one transition cycle.

In FIG. 23, the resonant current $I_{620}$ starts decreasing, and the load current $I_{LOAD}$ is diverted to diodes 650 and 656. Main switches 622 and 628 are turned on at zero voltage condition. At time $t_5$, the resonant current $I_{620}$ through inductor 616 equals the load current $I_{LOAD}$, and the diode currents are diverted to main switches 622 and 628.

Figure 24:
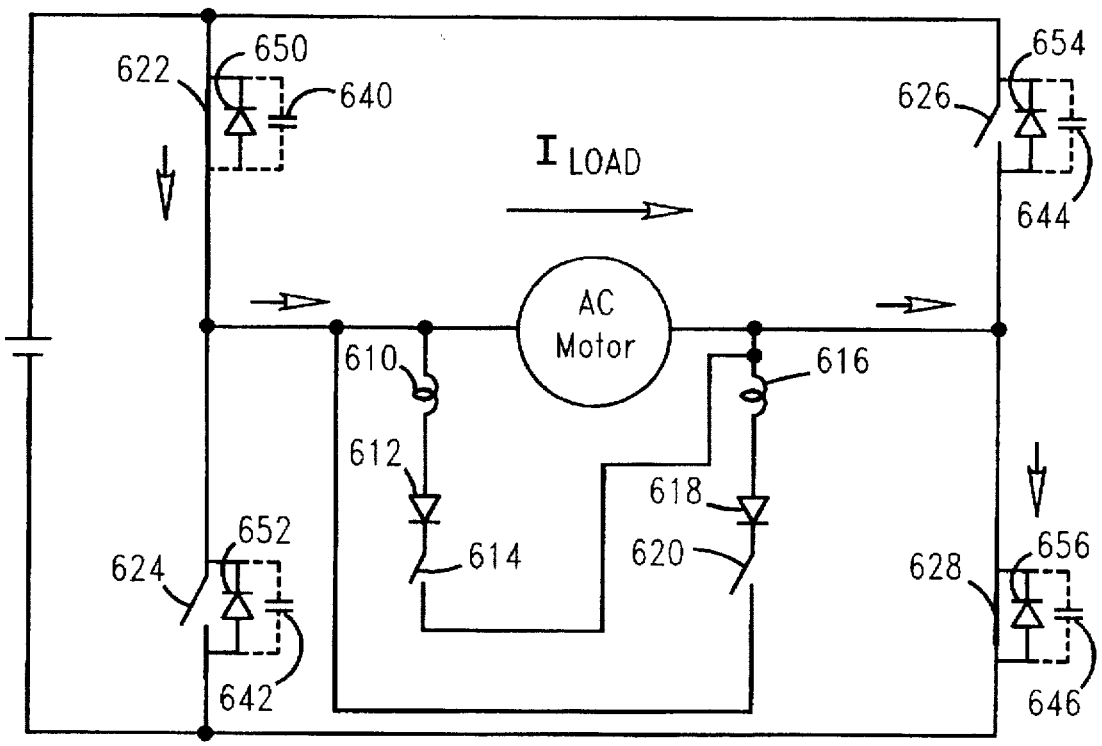
FIG. 24 is an illustration of the operating mode of the Δ-connected, single-phase inverter during time segment $t_5-t_6$ of one transition cycle.
Figure 25:
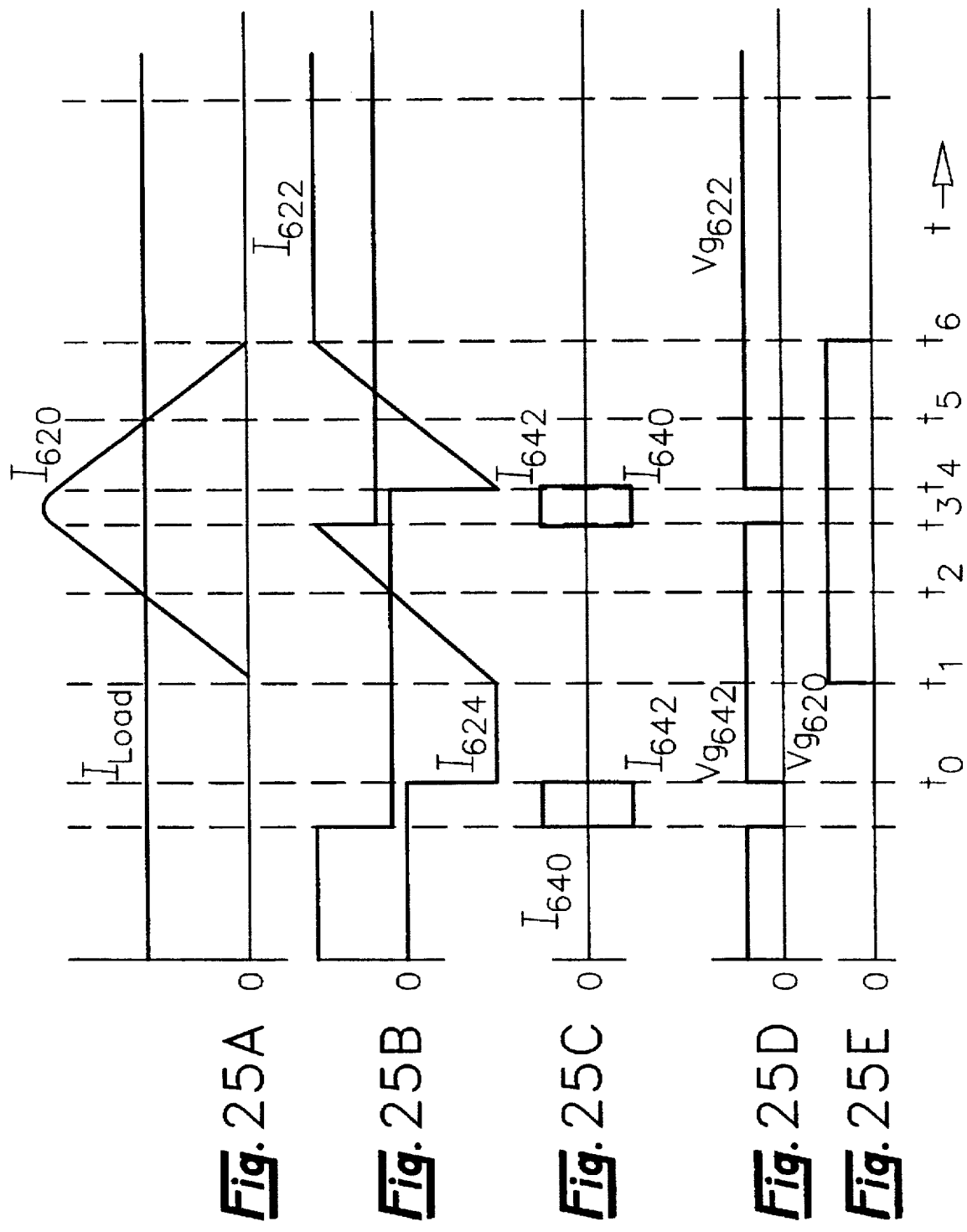
FIGS. 25A-E is a timing chart showing the corresponding waveforms for the different operating modes illustrated in FIGS. 19-24.

In FIG. 24, the resonant current through inductor 616 keeps decreasing, and the main switch current is increased linearly. At time $t_6$, the resonant current $I_{620}$ drops to zero, and the auxiliary switch 620 is turned off at zero current condition.

Figure 26:
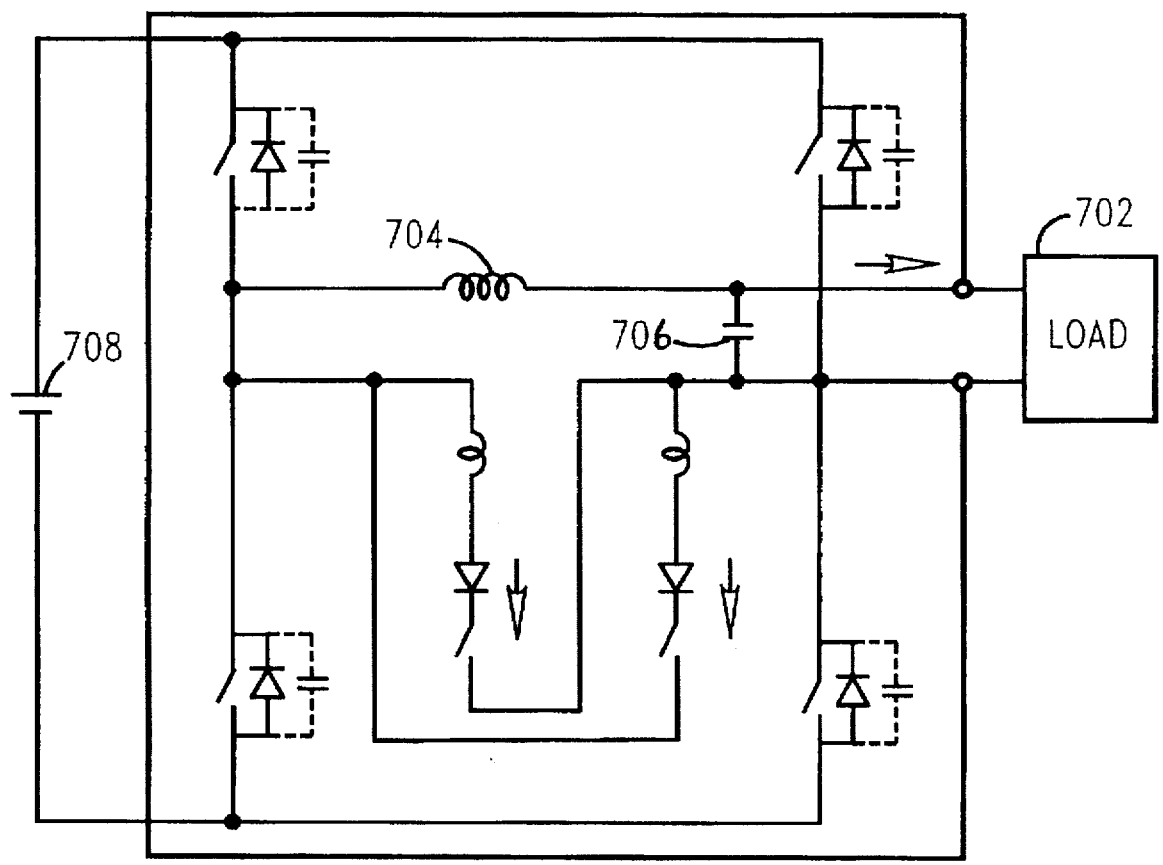
FIG. 26 is a circuit diagram of a Δ-connected, resonant snubber inverter circuit applied to a single-phase, uninterruptible power system.

As with the Y-connected embodiment of the present invention, the Δ-connected embodiment of the invention can also be embodied in various applications. FIG. 26 shows the Δ-connected, resonant snubber inverter circuit applied to a single-phase, uninterruptible power system. The circuit topology is the same as that shown in FIG. 17, but the output is filtered to provide pure sinusoidal ac output voltage to the load 702. The output filter can be a simple inductor 704 and capacitor 706 connected as shown. The dc voltage source 708 can be charged by a utility line (not shown).

Figure 27:
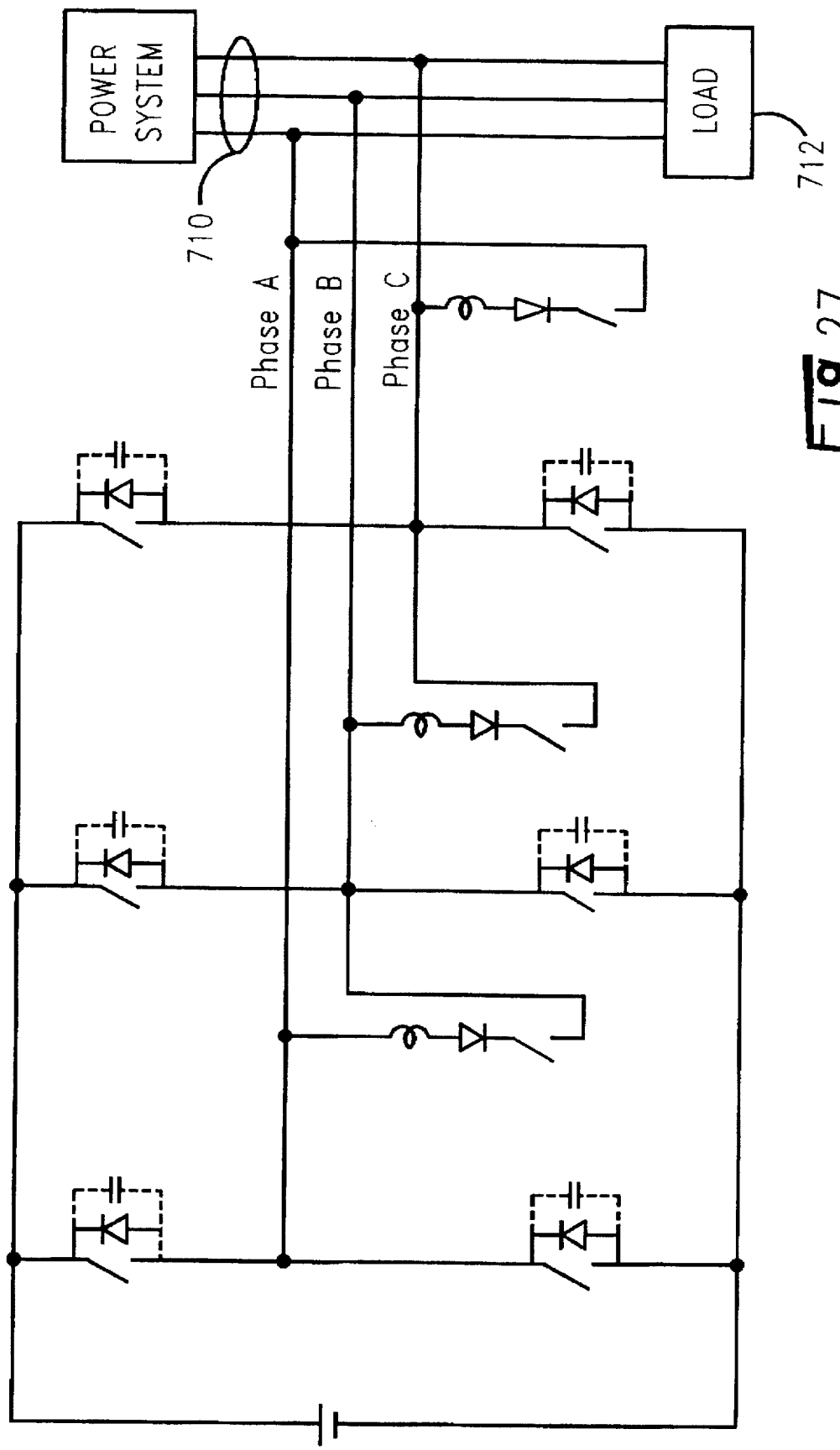
FIG. 27 is a circuit diagram of a Δ-connected, three-phase, resonant snubber inverter circuit configured for eliminating utility power line harmonics and reactive compensation.

FIG. 27 illustrates a Δ-connected, three-phase resonant snubber inverter circuit applied for eliminating utility power line harmonics and reactive compensation. The phase A, phase B, and phase C output terminals are directly tied to the utility power line 710. When the load 712 of the power system 714 draws reactive current or harmonically distorted current, the inverter can provide negative reactive current or anti-harmonic current to ensure a clean current waveform at the utility input.

It is contemplated, and will be apparent to those skilled in the art from the preceding description and accompanying drawings that modifications and/or changes may be made in the illustrated embodiments of the invention. Accordingly, it is expressly intended that the foregoing description and accompanying drawings are illustrative of preferred embodiments only, not limiting thereto, and that the true spirit and scope of the present invention be determined by reference to the appended claims.

We claim:

1. A resonant snubber inverter circuit comprising:
   a main inverter circuit having a plurality of main switches; and
   one or more snubber branches connected in a delta configuration to said main circuit for selectively conducting a resonant current that produces a zero voltage across predetermined ones of said main switches.

2. The inverter circuit as described in claim 1, wherein each of said snubber branches includes an inductor connected in series with a semiconductor switch.

3. The inverter circuit as described in claim 2, wherein said semiconductor switch is a power MOSFET device.

4. The inverter circuit as described in claim 1, wherein each of said snubber branches comprises:
   an inductor;
   a diode in series connection with said inductor; and
   a semiconductor switch in series connection with said inductor and said diode.

5. The inverter circuit as described in claim 1, further comprising sources of capacitance connected in parallel with each of said main switches, wherein said main switches supply current to said snubber branches to produce resonant current, said resonant current producing zero voltage across said main switches by repetitively charging and discharging said sources of capacitance to enable zero voltage turn-on of said inverter circuit main switches.

6. The inverter circuit as described in claim 1, wherein each of said resonant branches comprises a bi-directional switched, resonant branch.

7. The inverter circuit as described in claim 6, where each of said bi-directional switched, resonant branches comprises:
   an inductor; and
   a bi-directional switch connected in series with said inductor.

8. A resonant snubber-based, soft switching, multi-phase, inverter circuit for achieving lossless switching of circuit components, comprising:
   a main inverter circuit having a plurality of main switches and sources of capacitance in parallel with said main switches, said main circuit producing a plurality of current phases;
   an auxiliary resonant snubber circuit connected to said inverter circuit in a delta configuration and having a plurality of resonant snubber branches for repetitively producing zero voltage across each of said main switches and sources of capacitance, each of said snubber branches comprising an inductor and an auxiliary switch connected in series with said inductor; and
   a controller for controlling said main and auxiliary switches to achieve lossless switching by switching said auxiliary switches to produce zero voltage conditions across said main switches and by switching said main switches during said zero voltage conditions.

9. The inverter circuit as described in claim 8, wherein said sources of capacitance further comprise capacitance in parallel with each of said main switches, said capacitance being charged and discharged by a resonant current in said snubber branches.

10. The inverter circuit as described in claim 8, said main inverter circuit further comprising for each current phase:
    an upper semiconductor switch and a lower semiconductor switch, each having a source, gate, and drain;
    means for connecting the source of the upper semiconductor switch to the drain of the lower semiconductor switch; and
    a free-wheeling diode antiparalleled against each of said semiconductor switches;
    wherein the alternating current for each phase is produced at the source-drain junction of the two semiconductor switches for each phase.

11. The inverter circuit as described in claim 8, wherein each of said resonant branches comprises a bi-directional switched, resonant branch.

12. The inverter circuit as described in claim 11, wherein each of said bi-directional switched, resonant branches comprises:
    an inductor; and
    a bi-directional switch connected in series with said inductor.

13. A resonant snubber-based, soft switching, single-phase, inverter circuit for achieving lossless switching of circuit components, comprising:
    a main inverter circuit having a plurality of main switches and sources of capacitance connected to said main switches, said main circuit producing a single phase output current;
    an auxiliary resonant snubber circuit connected to said inverter circuit in a delta configuration and having one resonant snubber branch for repetitively producing zero voltage across each of said main switches and sources of capacitance, said snubber branch comprising an inductor and one bi-directional, auxiliary switch connected in series with said inductor; and
    a controller for controlling said main and auxiliary switches to achieve lossless switching by switching said auxiliary switch to produce zero voltage conditions across said main switches and by switching said main switches during said zero voltage conditions.

14. The inverter circuit as described in claim 13, wherein said sources of capacitance further comprise capacitance in parallel with each of said main switches, said capacitance being charged and discharged by a resonant current in said snubber branch.

15. A resonant snubber-based, soft switching, single-phase, inverter circuit for achieving lossless switching of circuit components, comprising:
    a main inverter circuit having a plurality of main switches and sources of capacitance connected to said main switches, said main circuit producing a single phase output current;
    an auxiliary resonant snubber circuit connected to said inverter circuit in a delta configuration and having two resonant snubber branches for repetitively producing zero voltage across each of said main switches and sources of capacitance, each of said snubber branches comprising an inductor and one auxiliary switch connected in series with said inductor; and a controller for controlling said main and auxiliary switches to achieve lossless switching by switching said auxiliary switches to produce zero voltage conditions across said main switches and by switching said main switches during said zero voltage conditions.

16. The inverter circuit as described in claim 15, wherein said sources of capacitance further comprise capacitance in parallel with each of said main switches, said capacitance being charged and discharged by a resonant current in said snubber branches.

17. The inverter circuit of claim 15, wherein each of said resonant snubber branches further comprises a diode, said resonant branches are connected in parallel and said diodes of said branches are oppositely oriented.

18. A method for achieving lossless resonant snubbing during switching of an inverter circuit having a first upper main switch and a first lower main switch connected in series, and a second upper main switch and a second lower main switch connected in series, each of the main switches having a parallel capacitance associated with the switch, the method comprising the steps of:

turning on the first lower main switch and second upper main switch so that the first lower and second upper main switches conduct current;

providing one or more resonant snubber branches, each of said snubber branches being connected in a delta configuration at junctions between said upper and lower main switches;

turning on a predetermined auxiliary switch located within a resonant snubber branch to produce increasing current flows in said resonant snubber branch and decreasing voltage across said first lower and second upper main switches;

turning off said first lower and second upper main switches when the voltage across said first lower and second upper switches is zero, thereby initiating resonant discharge of the capacitances located in parallel with the first upper main switch and the second lower main switch to produce a zero voltage condition across said first upper and second lower main switches; and turning on said first upper and second lower main switches at said zero voltage condition.

19. A method for achieving lossless resonant snubbing during transition cycle switching of an inverter circuit having a first upper main switch and a first lower main switch connected in series, a second upper main switch and a second lower main switch connected in series, and a load that is drawing a load current, said first upper and second lower switches in an initially off state with substantially zero current flow, said second upper and first lower switches in an initially on state with positive current flow, each of the main switches having a parallel capacitance associated with the switch, for one transition switching cycle the method comprising the steps of:

providing a first resonant snubber branch comprising:
 a first inductor;
 a first diode in series connection with said first inductor; and
 a first auxiliary semiconductor switch in series connection with said first inductor and said first diode;

providing a second resonant snubber branch comprising:
 a second inductor;
 a second diode in series connection with said second inductor; and
 a second auxiliary semiconductor switch in series connection with said second inductor and said second diode;

turning on the second auxiliary semiconductor switch to substantially linearly increase current flow through the second inductor and reduce the current flow through the second upper and first lower main switches to zero when the second inductor current equals the load current;

turning off the second upper and first lower main switches when the second inductor current is sufficient to charge and discharge said sources of capacitance, thereby charging the parallel capacitances associated with the second upper and first lower main switches until the second upper and first lower capacitances conduct current and discharging to zero voltage the parallel capacitances associated with the first upper and second lower main switches, producing zero voltage across said first upper and second lower main switches;

turning on the first upper and second lower main switches at zero voltage;

diverting the load current to antiparalleled diodes associated with the first upper and second lower main switches as the second inductor current decreases linearly;

diverting current from the antiparalleled diodes associated with the first upper and second lower main switches to the first upper and second lower main switches when the second inductor current equals the load current, producing linearly increasing current flow through the first upper and second lower main switches; and turning off the second auxiliary semiconductor switch when the second inductor current equals zero.

\* \* \* \* \*